United States Patent [19]
Suma et al.

[11] Patent Number: 5,652,725
[45] Date of Patent: Jul. 29, 1997

[54] SEMICONDUCTOR MEMORY DEVICE HAVING A REDUNDANT ROW AND A REDUNDANT COLUMN WHICH CAN BE ACCESSED PRIOR TO SUBSTITUTION

[75] Inventors: Katsuhiro Suma; Yasuhiko Tsukikawa; Masaki Tsukude, all of Hyogo, Japan

[73] Assignee: Mitsubishi Denki Kabushiki Kaisha, Tokyo, Japan

[21] Appl. No.: 624,829

[22] Filed: Mar. 27, 1996

[30] Foreign Application Priority Data

May 12, 1995 [JP] Japan ................................. 7-114518
Jan. 25, 1996 [JP] Japan ................................. 8-010777

[51] Int. Cl.[6] ........................................ G11C 7/00
[52] U.S. Cl. ................................ 365/200; 365/201
[58] Field of Search .............................. 365/200, 201, 365/230.06

[56] References Cited

U.S. PATENT DOCUMENTS 4,860,260  8/1989  Saito et al. .
5,206,831  4/1993  Wakamatsu ........................ 365/200
5,400,290  3/1995  Suma et al. .

OTHER PUBLICATIONS

"A 90ns 1Mb DRAM with Multi-Bit Test Mode" by Kumanoya et al., IEEE International Solid-State Circuits Conference 1985, pp. 240–241.

Primary Examiner—David C. Nelms
Assistant Examiner—F. Niranjan
Attorney, Agent, or Firm—Lowe, Price, LeBlanc & Becker

[57] ABSTRACT

A semiconductor memory device includes a memory cell array, a redundant row memory cell array, a redundant column memory cell array and a redundant column row memory cell array. A redundant row test activation signal, a redundant column test activation signal and a multi-bit test activation signal are activated in response to signals $\overline{RAS}$, $\overline{CAS}$ and $\overline{WE}$ and address key signals. In a redundant row test mode, a redundant word line is selectively driven in response to a row address signal. In a row column test mode, a redundant column selection line is selectively driven in response to a column address signal. In addition, data shrinking circuit is provided in order to enable a multi-bit test of redundant rows and redundant columns.

7 Claims, 28 Drawing Sheets

SEMICONDUCTOR MEMORY DEVICE HAVING A REDUNDANT ROW AND A REDUNDANT COLUMN WHICH CAN BE ACCESSED PRIOR TO SUBSTITUTION

BACKGROUND OF THE INVENTION

1. Field of the Invention

The present invention relates to a semiconductor memory device, and more particularly, to a semiconductor device having a redundant row and a redundant column which can be accessed prior to substitution.

2. Description of the Background Art

A redundancy technology is known as a technology for improving manufacture yield of semiconductor memory devices. This redundancy technology is a technology by which a specific address is programmed to a redundancy circuit by blowing fuse elements of polycrystalline polysilicon formed on a semiconductor chip by laser beams or the like, so that a redundant memory cell is substituted for a normal memory cell.

With higher integration degree in recent years, however, a problem has been occurred that a manufactured semiconductor memory device cannot be repaired as an acceptable product since defects exist in a redundant memory cell to be substituted. As a method of solving such a problem, an example of a semiconductor memory device which can be subjected to pre-inspection of spare memory cells prior to repair processing is disclosed in U.S. Pat. No. 4,860,260.

FIG. 31 is a block diagram showing an arrangement of the semiconductor memory device disclosed in the document described above. Referring to FIG. 31, this semiconductor memory device includes a main body memory 1 having a plurality of memory cells; a row decoder 3 responsive to a row address AR for selecting one of word lines WL; a column decoder 5 responsive to a column address AC for selecting one of bit lines BL; a sense amplifier 6 for amplifying data read from main body memory 1; and an output buffer 7. This semiconductor memory device further includes a spare memory 2 having a plurality of spare memory cells; a spare decoder 40 responsive to spare row enable signals SPE1–SPE4 or test signals TEST1'–TEST4' for selecting one of spare memory word lines SWL; and a defect address sensing circuit 80 to which a substitute address can be programmed and for generating the spare row enable signals SPE1–SPE4 when a row address AR agrees with the programmed substitute address.

In a normal operation, row decoder 3 selects one of word lines WL in response to an externally applied row address AR. Thus, data is read from memory cells connected to the selected word line onto bit lines BL. Then, column decoder 5 selects one of bit lines BL in response to an externally applied column address AC. Thus, data on the selected bit line is amplified by sense amplifier 6, and is externally output through output buffer 7. In such a normal operation, defective address sensing circuit 80 is in an inactive state, and spare decoder 40 is also in an inactive state. Accordingly, spare memory word lines SWL are in a non-selection state.

On the other hand, in an access operation of spare memory cells, an address of a defective memory cell is pre-programmed to a basic circuit 81 having fuse elements. When such a defective address is sensed, spare row enable signals SPE1–SPE4 from basic circuit 81 attain H levels, so that spare decoder 40 is activated. At the same time, row decoder 3 is deactivated. The activated spare decoder 40 selects one of spare memory word lines SWL. Thus, data is read from spare memory cells connected to the selected spare memory word line SWL onto bit lines BL. Then, as in the case of a normal operation, column decoder 5 selects one of bit lines BL in response to an externally applied column address AC, and data on the selected bit line BL is amplified by sense amplifier 6 and is externally output through output buffer 7.

A method of inspecting spare memory 2 in this semiconductor memory device will now be described. FIG. 32 shows a test mode sensing circuit used in this semiconductor memory device. This test mode sensing circuit includes an input pad PD to which an address signal is applied, an inverter 36 for inverting a signal applied to input pad PD and supplying the inverted signal to an internal address buffer, and an inverter 37 for producing an internal test signal. Inverter 37 is constituted by a P channel MOS transistor 38 for loading and an N channel field transistor 39 for driving. Threshold voltage of N channel field transistor 39 is set to a value (about 9 V) higher than that of the power supply voltage Vcc.

FIG. 33 shows a test signal decoder circuit responsive to an internal test signal TEST and complementary signals A0, $\overline{A0}$ and A1, $\overline{A1}$ of row address signals for generating internal test signals TEST1'–TEST4'. Four spare memory word lines SWL1–SWL4 are selectively driven according to combinations of such four complementary signals A0, $\overline{A0}$ and A1, $\overline{A1}$.

FIG. 34 shows an arrangement of basic circuit 81 in FIG. 31. This basic circuit 81 includes a plurality of N channel MOS transistors 12–16 connected in parallel to each other, a plurality of fuse elements 18–22 each connected in series with a corresponding N channel MOS transistor, and a P channel MOS transistor 17 connected in common with these fuse elements 18–22.

In a test operation of the spare memory, voltage (for example, 10 V) higher than threshold voltage of N channel field transistor 39 is applied to input pad PD. Thus, an output signal (internal test signal $\overline{TEST}$) of inverter 37 is rendered at a low potential. An inverted signal TEST thereof is applied to the test signal decoder circuit, so that one of test signals TEST1'–TEST4' is activated in response to address signals A0 and A1.

For example, in the case of (A0, A1)=(1, 1), a test signal TEST1' attains an H level and other test signals TEST2'–TEST4' are kept at L levels. Accordingly, one spare memory word line SWL1 is selected in response to such internal test signals TEST1'–TEST4'. In addition, normal row decoder 3 is deactivated in response to internal test signals TEST1'–TEST4'. An operation thereafter is similar to an operation in the case where a spare memory cell is accessed. Thus, according to such a semiconductor memory device, a spare memory cell can be tested without blowing fuse elements.

In the conventional semiconductor memory device described above, however, since one internal test signal is required for each OR gate 41 for selecting one spare memory word line, multiple signal lines are required. Accordingly, a large area for these signal lines is necessary, resulting in increase in chip size.

Furthermore, size of NOR gate 82 to which spare row enable signals SPE1–SPE4 and internal test signals TEST1'–TEST4' are applied increases. Even if NOR gate 82 is divided, the number of logic gates required increases with increase in the number of spare memory cells to be selected, resulting in increase in chip size.

Furthermore, in a semiconductor memory device (for example, a 16M bit dynamic RAM) having higher integration degree in recent years, since multiple spare memory cells are placed in a column direction as well as in a row direction, neither rows nor columns can be accessed simply prior to substitution in such an arrangement.

In particular, in the case where spare memory cells are provided in row and column directions, a spare memory cell located at an intersection of a redundant row and a redundant column must be tested in order to substitute a redundant row and a redundant column simultaneously, such a test cannot be performed according to such an arrangement.

In addition, in the test mode sensing circuit of FIG. 32, high voltage must continue to be applied to input pad PD for the whole period in a test mode of the spare memory. Therefore, input pad PD cannot use an address pin which is used for selecting a spare memory cell, and separate pads PD must be provided for spare memory cells.

If the above-described sensing circuit 80 is provided in each memory array block in a semiconductor memory device capable of performing a selective operation, a functional test for spare memory cells must be performed using an address for selecting a memory array block to be operated. Therefore, relationship between an address used for block selection and an address for a spare memory cell must be considered.

SUMMARY OF THE INVENTION

It is therefore an object of the present invention to provide a semiconductor memory device having redundant rows and redundant columns which can be accessed prior to substitution.

It is another object of the present invention to provide a semiconductor memory device having a mode of testing redundant rows and redundant columns in response to a special combination of control signals.

It is a further object of the present invention to provide a semiconductor memory device having redundant rows and redundant columns which can be subjected to a multi-bit test.

It is a still further object of the present invention to implement a semiconductor memory device having redundant rows which can be accessed prior to substitution with increase in chip area being suppressed.

It is a yet further object of the present invention to implement a semiconductor memory device having redundant columns which can be accessed prior to substitution with increase in chip area being suppressed.

According to the present invention, a semiconductor device includes a plurality of normal word lines; a plurality of normal bit line pairs located across the normal word lines; a plurality of normal memory cells located respectively corresponding to intersections of the normal word lines and the normal bit line pairs; a normal row selecting circuit responsive to an externally applied row address signal for selecting one of the normal word lines; a normal column selecting circuit responsive to an externally applied row address signal for selecting one of the normal bit line pairs; a redundant word line located across the normal bit line pairs; a redundant bit line pair located across the normal word lines and the redundant word line; a plurality of redundant row memory cells located respectively corresponding to intersections of the redundant word line and the normal bit line pairs; a plurality of redundant column memory cells located respectively corresponding to intersections of the redundant bit line pair and the normal word lines; a redundant row column memory cell located corresponding to an intersection of the redundant word line and the redundant bit line pair; a redundant row selecting circuit for selecting the redundant word line; a row substituting circuit for deactivating the normal row selecting circuit and activating the redundant row selecting circuit when a row address signal to be applied to the normal row selecting circuit indicates a predetermined row substitute address; a row substitution control circuit responsive to a predetermined row test signal for forcibly controlling the row substituting circuit so as to deactivate the normal row selecting circuit and to activate the redundant row selecting circuit; a redundant column selecting circuit for selecting the redundant bit line pair; a column substituting circuit for deactivating the normal column selecting circuit and activating the redundant column selecting circuit when a column address signal to be applied to the normal column selecting circuit indicates a column substitute address; and a column substitution control circuit responsive to a predetermined column test signal for forcibly controlling the column substituting circuit so as to deactivate the normal column selecting circuit and to activate the redundant column selecting circuit.

Accordingly, since the redundant row selecting circuit and the redundant column selecting circuit are activated in response to a predetermined row test signal and a predetermined column test signal, respectively, a redundant row to be substituted for a defective normal row can be tested before substitution to determine whether the redundant row is acceptable or not, and a redundant column to be substituted for a defective normal column can be tested before substitution to determine whether the redundant column is acceptable or not. Consequently, a semiconductor memory device can surely repaired by substituting a redundant row for a normal row or substituting a redundant column for a normal column, resulting in improvement in manufacture yield.

The semiconductor memory device described above further includes a test signal generating circuit responsive to an externally applied control signal for generating the row test signal and/or the column test signal.

Accordingly, since one or both of the row test signal and the column test signal are produced internally in response to an externally applied control signal, test of determining whether a redundant row and a redundant column are acceptable or not can be performed even after packaging the semiconductor memory device by resin molding.

The semiconductor memory device described above further includes a parallel reading circuit responsive to a single row address signal and a single column address signal for reading in parallel a plurality of data from one of the normal memory cells; and an agreement/non-agreement detecting circuit responsive to a predetermined multi-bit test signal for detecting whether all the data read by the parallel reading circuit agree with each other or not, and generating an agreement/non-agreement detection signal which indicates a first value when all the data agree with each other and indicates a second value different from the first value when one of the data does not agree with other data. The test signal generating circuit further generates the multi-bit test signal in response to an externally applied control signal.

Accordingly, since multi-bit test of data read from a redundant row and a redundant column can be carried out, reduction in time required for such a test of determining whether a redundant row and a redundant column are acceptable or not as described above can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings. It is noted that a like reference indicates a like or a corresponding portion in the figures.

Figure 1:
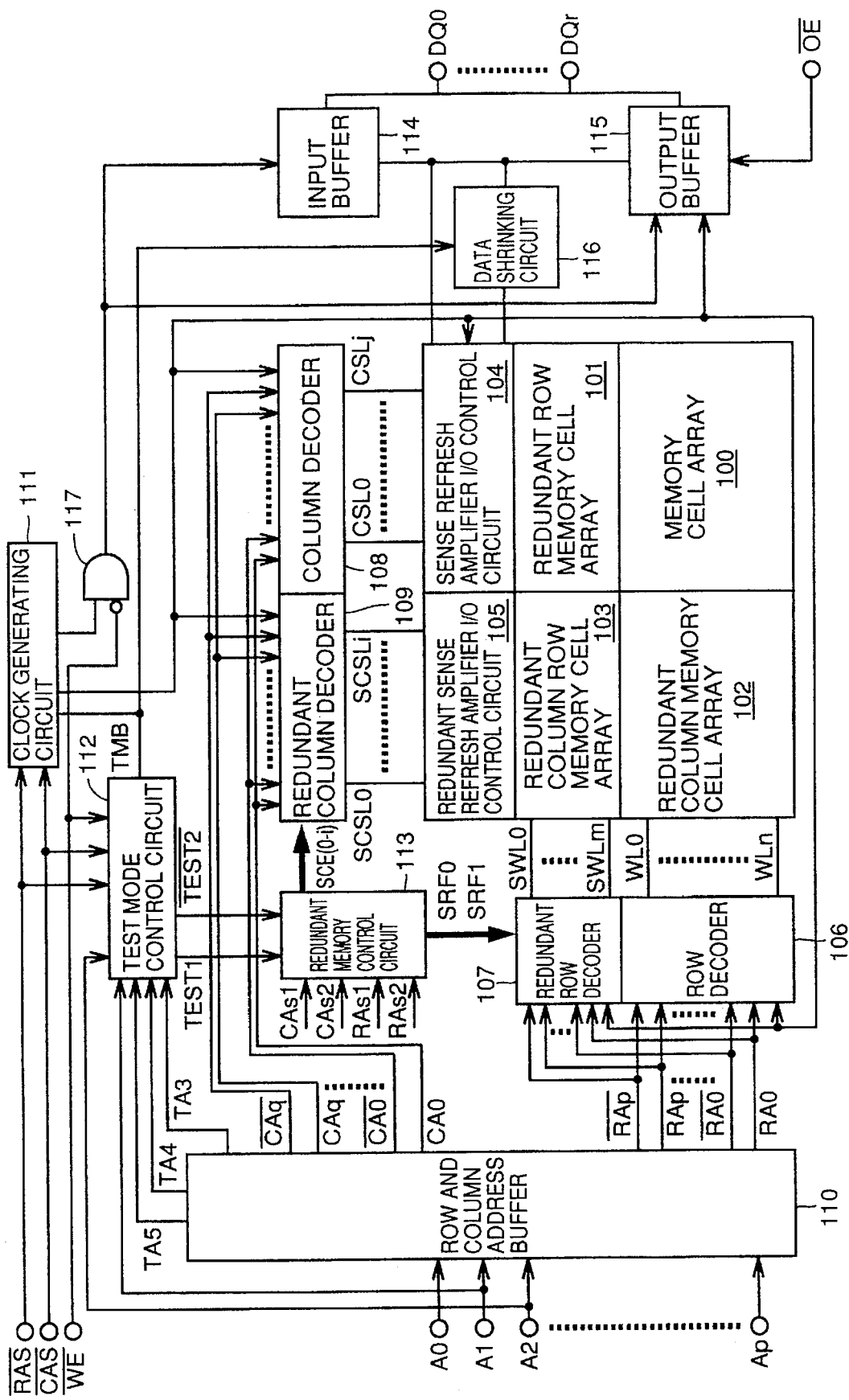
FIG. 1 is a block diagram showing the whole arrangement of a semiconductor memory device in accordance with a first embodiment of the present invention.

First Embodiment (1) Whole Arrangement of a Semiconductor Memory Device (FIG. 1)

FIG. 1 is a block diagram showing the whole arrangement of a semiconductor memory device in accordance with a first embodiment of the present invention. Referring to FIG. 1, the semiconductor memory device includes a normal memory cell array (hereinafter referred to as "memory cell array" for simplicity) 100 having a plurality of normal memory cells; a redundant row memory cell array 101 having a plurality of redundant row memory cells; a redundant column memory cell array 102 having a plurality of redundant column memory cells; and a redundant column row memory cell array 103 having a plurality of redundant column row memory cells. Furthermore, a plurality of normal word lines (hereinafter referred to as "word line" for simplicity) WL0–WLn are located through memory cell array 100 and redundant column memory cell array 102, and a plurality of redundant word lines SWL0–SWLm are located through redundant row memory cell array 101 and redundant column row memory cell array 103. On the other hand, a plurality of column selection lines CSL0–CSLj are located through memory cell array 100 and redundant row memory cell array 101, and a plurality of redundant column selection lines SCSL0–SCSLi are located through redundant column memory cell array 102 and redundant column row memory cell array 103.

The semiconductor memory device further includes a sense refresh amplifier I/O control circuit 104 for amplifying data read from memory cell array 100 and redundant row memory cell array 101 and controlling input/output of data, and a redundant sense refresh amplifier I/O control circuit 105 for amplifying data read from redundant column memory cell array 102 and redundant column row memory cell array 103 and controlling input/output of data.

The semiconductor memory device further includes a row decoder 106 responsive to internal row address signals RA0–RAp and their respective complementary signals $\overline{RA0}$–$\overline{RAp}$ for selecting one of the word lines WL0–WLn, and a redundant row decoder 107 for selecting one of the redundant word lines SWL0–SWLm when any of word lines WL0–WLn is defective or function of a redundant row is to be tested.

The semiconductor memory device further includes a column decoder 108 responsive to internal column address signals CA0–CAq and their respective complementary signals $\overline{CA0}$–$\overline{CAq}$ for selecting one of column selection lines CSL0–CSLj, and a redundant column decoder 109 for selecting one of the redundant column selection lines SCSL0–SCLSi when any of the column selection lines CSL0–CSLj is defective or when function of a redundant column is to be tested.

The semiconductor memory device further includes a row and column address buffer 110 responsive to externally applied address Signals A0–Ap for supplying internal row address signals RA0–RAp and $\overline{RA0}$–$\overline{RAp}$ to row decoder 106 and redundant row decoder 107 and supplying internal column address signals CA0–CAq and $\overline{CA0}$–$\overline{CAq}$ to column decoder 108 and redundant column decoder 109; a clock generating circuit 111 responsive to a row address strobe signal $\overline{RAS}$ and a column address strobe signal $\overline{CAS}$ for generating various internal control signals; a logic gate 117 for receiving a write enable signal $\overline{WE}$; an input buffer 114 responsive to an output signal of logic gate 117 for supplying externally applied data DQ0–DQr to sense refresh amplifier I/O control circuit 104 and redundant sense refresh amplifier I/O control circuit 105; an output buffer 115 responsive to an output signal of logic gate 117 and an output enable signal $\overline{OE}$ for externally outputting data from sense refresh amplifier I/O control circuit 104 and redundant sense refresh amplifier I/O control circuit 105; and a data shrinking circuit 116 for performing a multi-bit test of the JEDEC standard.

In addition, as a feature of the present invention, the semiconductor memory device further includes a test mode control circuit 112 responsive to a row address strobe signal $\overline{RAS}$, a column address strobe signal $\overline{CAS}$, a write enable signal $\overline{WE}$, external address signals A1 and A2, and address key signals TA3–TA5 for test for selectively generating a redundant row test activation signal TEST1, a redundant column test activation signal $\overline{TEST2}$ and a multi-bit test activation signal TMB; and a redundant memory control circuit 113 responsive to a redundant row test activation signal TEST1, a redundant column test activation signal $\overline{TEST2}$, auxiliary row address signals RAs1 and RAs2, and auxiliary column address signals CAs1 and CAs2 for generating redundant row decoder activation signals SRF0 and SRF1 and redundant column decoder activation signals SCE0–SCEi. External address signals A1 and A2 are applied directly to test mode control circuit 112. In addition, row and column address buffer 110 supplies address key signals TA3–TA5 for selecting a test mode to test mode control circuit 112 in response to external address signals A3–A5 (not shown). Redundant memory control circuit 113 includes a program circuit to which substitute addresses can be programmed as conventional and a substitute address sensing circuit, selectively activates redundant row decoder activation signals SRF0 and SRF1 in response to auxiliary row address signals RAs1 and RAs2 when a redundant row test activation signal TEST1 is newly applied, and selectively activates redundant column decoder activation signals SCE0–SCEi in response to auxiliary column address signals CAs1 and CAs2 when a redundant column test activation signal $\overline{TEST2}$ is applied.

Figure 2:
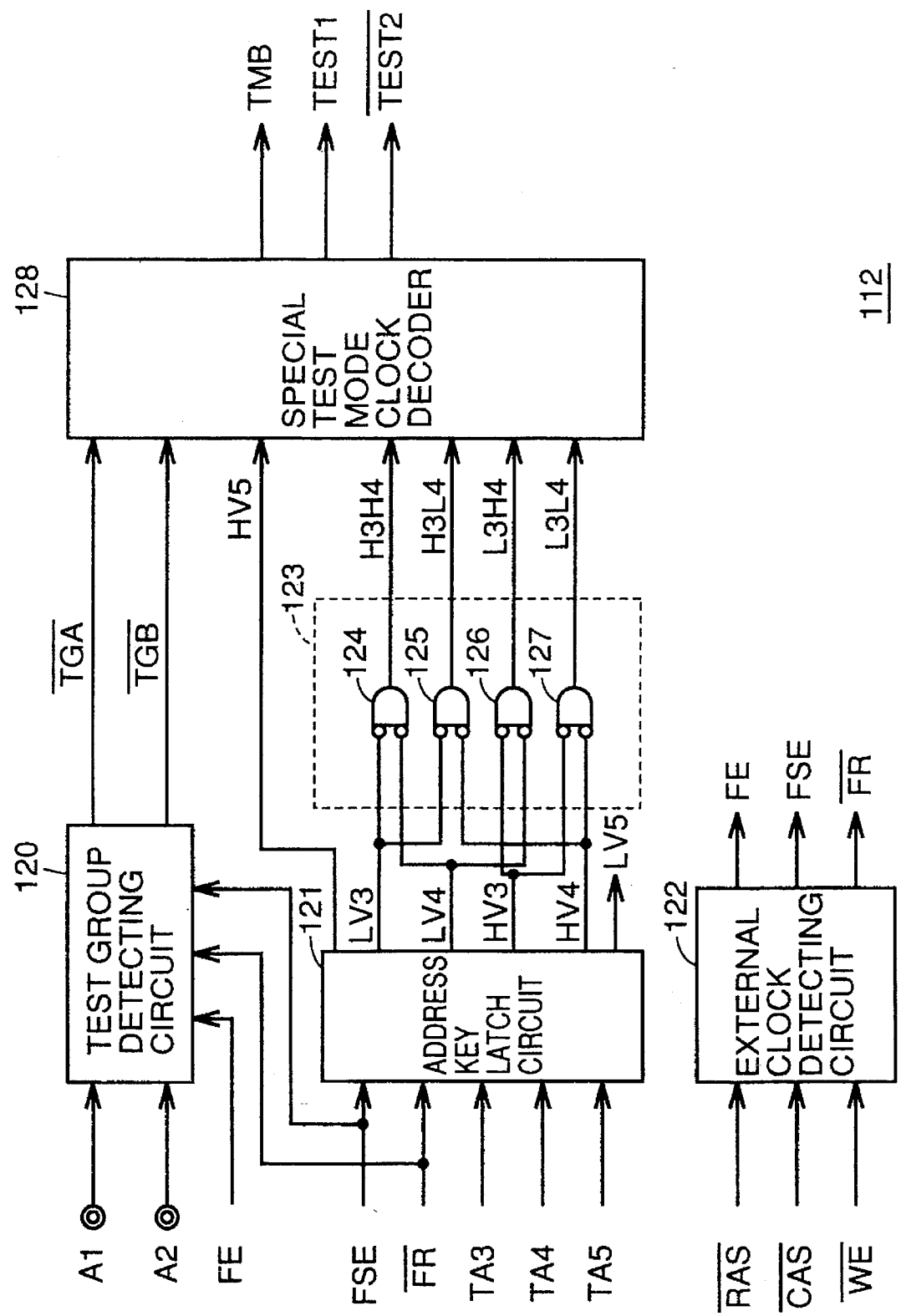
FIG. 2 is a block diagram showing an arrangement of a test mode control circuit in FIG. 1.

(2) Test Mode Control Circuit (FIG. 2)

FIG. 2 is a block diagram showing an arrangement of a test mode control circuit 112 in FIG. 1. Referring to FIG. 2, this test mode control circuit 112 includes an external clock detecting circuit 122 for detecting prescribed timings of an externally applied row address strobe signal $\overline{RAS}$, an externally applied column address strobe signal $\overline{CAS}$, and an externally applied write enable signal $\overline{WE}$ to generate a test mode activation signal FE, an address key latch control signal FSE, and a test mode reset signal $\overline{FR}$; a test group detecting circuit 120 responsive to these signals FE, FSE and $\overline{FR}$ for detecting states of address pins A1 and A2 to generate special test group signals $\overline{TGA}$ and $\overline{TGB}$; an address key latch circuit 121 responsive to signals FSE and $\overline{FR}$ for latching address key signals TA3–TA5; an address key pre-decoder 123 for pre-decoding latched signals LV3, LV4, HV3 and HV4; and a special test mode clock decoder 128 for decoding special test group signals $\overline{TGA}$ and $\overline{TGB}$, address key pre-decode signals H3H4, H3L4, L3H4 and L3L4 from address key pre-decoder 123, and a signal HV5 latched in address key latch circuit 121, thereby generating a redundant row test activation signal TEST1, a redundant column test activation signal $\overline{TEST2}$, and a multi-bit test activation signal TMB.

Test group detecting circuit 120 detects whether voltage applied to address pins A1 and A2 is at an H level, an L level or a super H level (which is higher than a normal H level), thereby outputting test group signals $\overline{TGA}$ and $\overline{TGB}$. Address key latch circuit 121 senses whether voltage applied to address pins corresponding to address key signals TA3–TA5 is at an H level or an L level, and outputs address key latch signals HV3–HV5 at H levels if the voltage is at an H level, and outputs address key latch signals LV3–LV5 at H levels if the voltage is at an L level. Address key pre-decoder 123 includes four NOR gates 124–127, and outputs address key pre-decode signals H3H4, H3L4, L3H4 and L3L4 in response to address key latch signals HV3, HV4, LV3 and LV4. For example, a pre-decode signal H3H4 attains an H level when an address key latch signal HV3 is at an H level and an address key latch signal HV4 is at an H level. In address key pre-decoder 123, since complementary address key latch signals LV3 and HV3 or LV4 and HV4 are used, one NOR gate produces one pre-decode signal.

Figure 3:
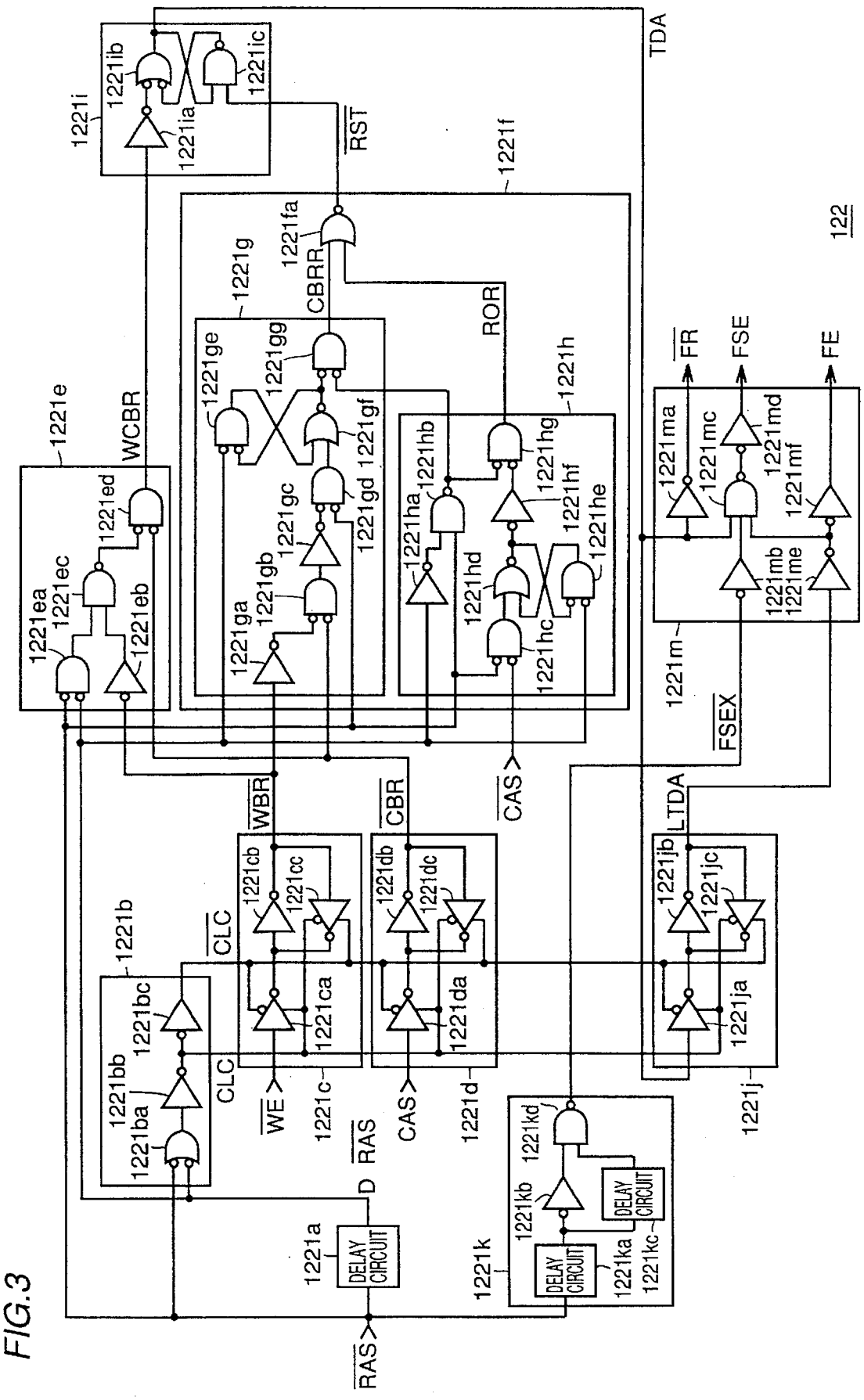
FIG. 3 is a block diagram showing an arrangement of an external clock detecting circuit in FIG. 2.

(2.1) External Clock Detecting Circuit (FIG. 3)

FIG. 3 is a circuit diagram showing an arrangement of the external clock detecting circuit in FIG. 2. This external clock detecting circuit 122 detects a WCBR ($\overline{WE}$, $\overline{CAS}$ Before $\overline{RAS}$) timing which is a set timing of a multi-bit test mode, and an ROR ($\overline{RAS}$ Only Refresh) or a CBR ($\overline{CAS}$ Before $\overline{RAS}$) refresh timing which is a reset timing.

Referring to FIG. 3, this external clock detecting circuit 122 includes a delay circuit 1221a; a clocked inverter control circuit 1221b having an NAND gate 1221ba and inverters 1221bb and 1221bc; and a WBR ($\overline{WE}$ Before $\overline{RAS}$) detecting circuit 1221c. Delay circuit 1221a outputs a delay signal $\overline{DRAS}$ of a row address strobe signal $\overline{RAS}$. Clocked inverter control circuit 1221b outputs a clocked inverter control signal CLC which is kept at an L level from the time when a row address strobe signal $\overline{RAS}$ falls to an L level until a delay signal $\overline{DRAS}$ rises to an H level after the row address strobe signal $\overline{RAS}$ has risen to an H level, and an inverted signal $\overline{CLC}$ thereof. NAND gate 1221ba outputs a signal at an L level when both a row address strobe signal $\overline{RAS}$ and a delay signal $\overline{DRAS}$ attain H levels. WBR detecting circuit 1221c receives a write enable signal $\overline{WE}$ and clocked inverter control signals CLC and $\overline{CLC}$, and outputs a WBR detection signal $\overline{WBR}$ which goes to an L level when the write enable signal $\overline{WE}$ initially goes to an L level and a row address strobe signal $\overline{RAS}$ then goes to an L level. When clocked inverter control signals CLC and $\overline{CLC}$ go to an H level and an L level, respectively, this WBR detecting circuit 1221c causes a WBR detection signal $\overline{WBR}$ to have the same logic as that of a write enable signal $\overline{WE}$, and when clocked inverter control signals CLC and $\overline{CLC}$ go to an L level and an H level, respectively, it holds a WBR detection signal $\overline{WBR}$ at that time.

External clock detecting circuit 122 further includes a CBR detecting circuit 1221d for receiving a column address strobe signal $\overline{CAS}$ and clocked inverter control signals CLC and $\overline{CLC}$ and outputting a CBR detection signal $\overline{CBR}$ which goes to an L level when the column address strobe signal $\overline{CAS}$ initially goes to an L level and a row address strobe signal $\overline{RAS}$ then goes to an L level. This CBR detecting circuit 1221d includes a clocked inverter 1221da, an inverter 1221db and a clocked inverter 1221dc. When clocked inverter control signals CLC and $\overline{CLC}$ go to an H level and an L level, respectively, this CBR detecting circuit 1221d causes a CBR detection signal $\overline{CBR}$ to have the same logic as that of a write enable signal $\overline{WE}$, and when clocked inverter control signals CLC and $\overline{CLC}$ go to an L level and an H level, respectively, it holds a CBR detection signal $\overline{CBR}$ at that time.

External clock detecting circuit 122 further includes a WCBR timing detecting circuit 1221e for receiving a row address strobe signal $\overline{RAS}$, a delay signal $\overline{DRAS}$ thereof, a WBR detection signal $\overline{WBR}$ and a CBR detection signal $\overline{CBR}$ and outputting a WCBR timing detection signal WCBR. This WCBR timing detecting circuit 1221e includes an NOR gate 1221ea for outputting a signal at an H level when a row address strobe signal $\overline{RAS}$ and a delay signal D$\overline{RAS}$ thereof are both at L levels, an inverter 1221eb, an NAND gate 1221ec, and an NOR gate 1221ed. Therefore, when a WBR detection signal $\overline{WBR}$ and a CBR detection signal $\overline{CBR}$ fall to L levels, that is, when a row address strobe signal $\overline{RAS}$, a column address strobe signal $\overline{CAS}$ and a write enable signal $\overline{WE}$ are input at a WCBR timing, this WCBR timing detecting circuit 1221e outputs a WCBR timing detection signal WCBR which is set to be at an H level in response to fall of a delay signal $\overline{DRAS}$ to an L level after the row address strobe signal $\overline{RAS}$ and is reset to be at an L level in response to rise of the row address strobe signal $\overline{RAS}$ to an H level.

External clock detecting circuit 122 further includes a reset timing detecting circuit 1221f for receiving a row address strobe signal $\overline{RAS}$, a delay signal $\overline{DRAS}$ thereof, a column address strobe signal $\overline{CAS}$, a WBR detection signal $\overline{WBR}$ and a CBR detection signal $\overline{CBR}$ and outputting a reset timing detection signal $\overline{RST}$. If a row address strobe signal $\overline{RAS}$, a column address strobe signal $\overline{CAS}$ and a write enable signal $\overline{WE}$ are input at a CBR refresh timing and a WBR detection signal $\overline{WBR}$ rises to an H level and a CBR detection signal $\overline{CBR}$ falls to an L level, or if a row address strobe signal $\overline{RAS}$ and a column address strobe signal $\overline{CAS}$ are input at an ROP timing, this reset timing detection signal $\overline{RST}$ is at an L level for a prescribed period after rise of the row address strobe signal $\overline{RAS}$ to an H level.

This reset timing detecting circuit 1221f includes a CBR refresh timing detecting circuit 1221g for receiving a row address strobe signal $\overline{RAS}$, a delay signal $\overline{DRAS}$ thereof, a WBR detection signal $\overline{WBR}$ and a CBR detection signal $\overline{CBR}$ and outputting a CBR refresh timing detection signal CBRR. If a row address strobe signal $\overline{RAS}$, a column address strobe signal $\overline{CAS}$ and a write enable signal $\overline{WE}$ are input at a CBR refresh timing, and a WBR detection signal $\overline{WBR}$ rises to an H level and a CBR detection signal $\overline{CBR}$ falls to an L level, this CBR refresh timing detection signal CBRR is at an H level for a prescribed period after fall of the row address strobe signal $\overline{RAS}$ to an L level. This CBR refresh timing detecting circuit 1221g includes an inverter 1221ga, an NOR gate 1221gb, an inverter 1221gc, an NOR gate 1221gd, an NOR gate 1221ge, an NOR gate 1221gf and an NOR gate 1221gg. NOR gates 1221ge and 1221gf constitute a flip-flop circuit.

This reset timing detecting circuit 1221f further includes an ROR refresh timing detecting circuit 1221h and an NOR gate 1221fa. This ROR refresh timing detecting circuit 1221h has an inverter 1221ha, an NAND gate 1221hb, an NOR gate 1221hc, an NOR gate 1221hd, an NOR gate 1221he, an inverter 1221hf and an NOR gate 1221hg. NOR gates 1221hd and 1221he constitute a flip-flop circuit. ROR refresh timing detecting circuit 1221h receives a row address strobe signal $\overline{RAS}$, a delay signal $\overline{DRAS}$ thereof and a column address strobe signal $\overline{CAS}$, and outputs an ROR timing detection signal ROR. If a row address strobe signal $\overline{RAS}$ and a column address strobe signal $\overline{CAS}$ are input at an ROR timing, this ROR timing detection signal ROR is at an H level for a prescribed period after rise of the row address strobe signal $\overline{RAS}$ to an H level. In addition, NOR gate 1221fa receives a CBR refresh timing detection signal CBRR and an ROR timing detection signal ROR, and outputs a reset timing detection signal $\overline{RST}$. If at least one of the CBR refresh timing detection signal CBRR and the ROR timing detection signal ROR is at an H level, this reset timing detection signal $\overline{RST}$ falls to an L level.

External clock detecting circuit 122 further includes a set/reset circuit 1221i for receiving a WCBR timing detection signal WCBR and a reset timing detection signal $\overline{RST}$ and outputting a timing detection signal TDA. This set/reset circuit 1221i has an inverter 1221ia, an NAND gate 1221ib and an NAND gate 1221ic. NAND gates 1221ib and 1221ic constitute a flip-flop circuit. Accordingly, if a row address strobe signal $\overline{RAS}$, a column address strobe signal $\overline{CAS}$ and a write enable signal $\overline{WE}$ are input at a WCBR timing, and a reset timing detection signal $\overline{RST}$ goes to an H level with a WCBR timing detection signal WCBR being at an H level, a timing detection signal TDA is set to be at an H level. On the other hand, if a row address strobe signal $\overline{RAS}$, a column address strobe signal $\overline{CAS}$ and a write enable signal $\overline{WE}$ are input at a CBR refresh timing or an ROR timing, and a reset timing detection signal $\overline{RST}$ goes to an L level with a WCBR timing detection signal WCBR being at an L level upon rise of a row address strobe signal $\overline{RAS}$ to an H level, a timing detection signal TDA is reset to be at an L level.

External clock detecting circuit 122 further includes a timing detection signal latch circuit 1221j for receiving a timing detection signal TDA and clocked inverter control signals CLC and $\overline{CLC}$ and outputting a timing detection latch signal LTDA. This timing detection signal latch circuit 1221j has a clocked inverter 1221ja, an inverter 1221jb and a clocked inverter 1221jc. Therefore, when clocked inverter control signals CLC and $\overline{CLC}$ are at an H level and an L level, respectively, a timing detection latch signal LTDA is caused to have the same logic as that of a timing detection signal TDA. On the other hand, if clocked inverter control signals CLC and $\overline{CLC}$ go to an L level and an H level, respectively, a timing detection latch signal LTDA at that time is held.

External clock detecting circuit 122 further includes a pulse generating circuit 1221k for receiving a row address strobe signal $\overline{RAS}$ and outputting a pulse signal $\overline{FSEX}$. This pulse generating circuit 1221kc has a delay circuit 1221ka, an inverter 1221kb, a delay circuit 1221kc and an NAND gate 1221kd. Therefore, after a prescribed time period has passed after a row address strobe signal $\overline{RAS}$ fell to an L level, a pulse signal $\overline{FSEX}$ falls to an L level for a prescribed time period.

External clock detecting circuit 122 further includes a timing detection signal generating circuit 1221m for receiving a timing detection signal TDA, a timing detection latch signal LTDA and a pulse signal $\overline{FSEX}$ and outputting a test mode reset signal $\overline{FR}$, an address key latch control signal FSE and a test mode activation signal FE. This timing detection signal generating circuit 1221m has inverters 1221ma and 1221mb, an NAND gate 1221mc, and inverters 1221md, 1221me and 1221mf. Therefore, a test mode reset signal $\overline{FR}$ is an inverted signal of a timing detection signal TDA. An address key latch control signal FSE attains an H level if a timing detection signal TDA is at an H level, a pulse signal $\overline{FSEX}$ is at an L level and a timing detection latch signal LTDA is at an L level. A test mode activation signal FE has the same logic as that of a timing detection latch signal LTDA.

Figure 4:
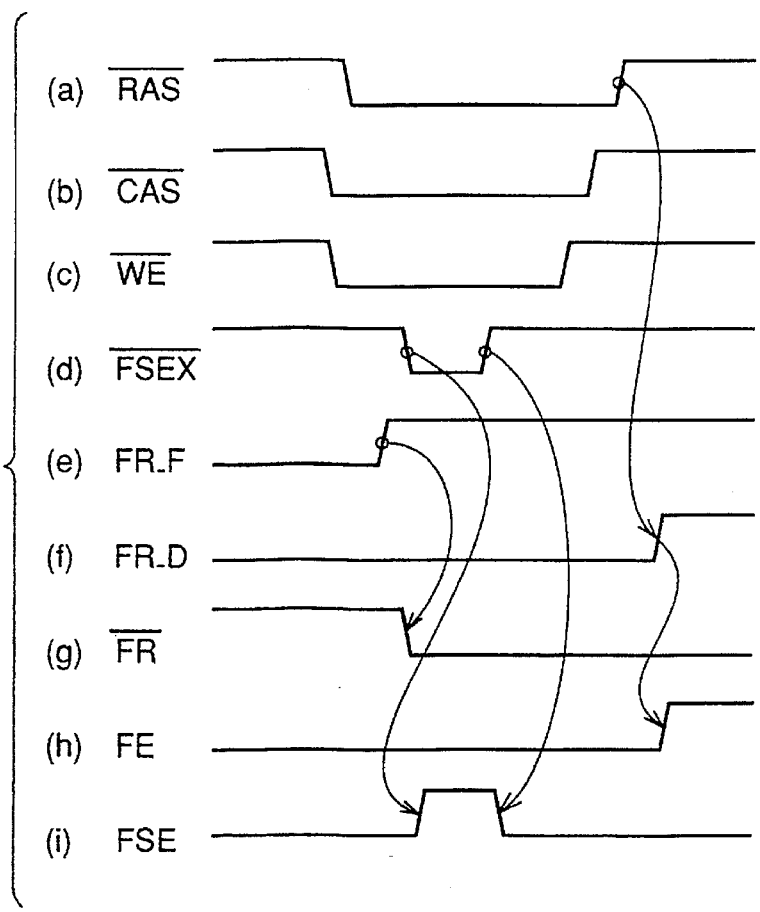
FIG. 4 is a timing chart showing a set operation by WCBR of the external clock detecting circuit 122 of FIG. 3.
Figure 5:
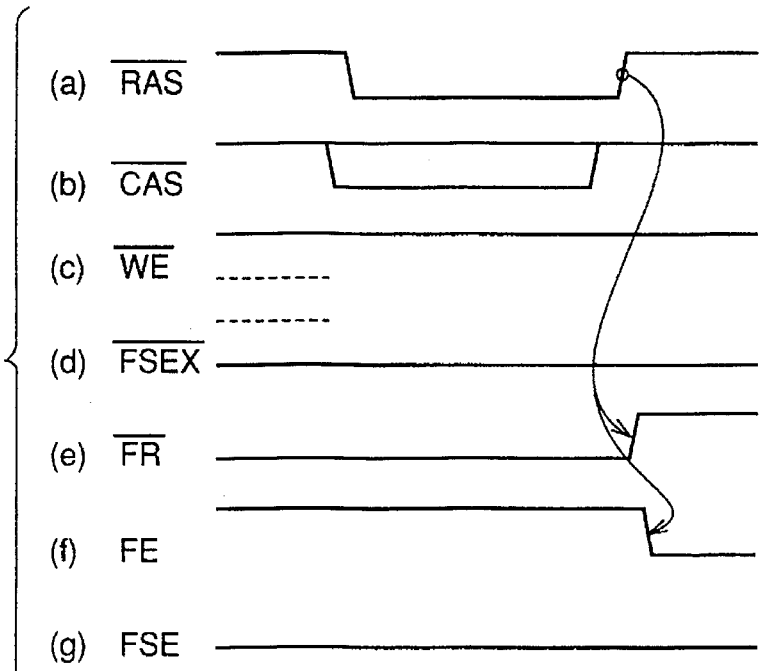
FIG. 5 is a timing chart showing a reset operation by ROR or CBR of the external clock detecting circuit of FIG. 3.

FIG. 4 is a timing chart showing a set operation of external clock detecting circuit 122 at a WCBR timing. FIG. 5 is a timing chart showing a reset operation of external clock detecting circuit 122 at a CBR refresh timing or an ROR timing. As shown in FIG. 4, if a row address strobe signal $\overline{RAS}$, a column address strobe signal $\overline{CAS}$ and a write enable signal $\overline{WE}$ are input at an WCBR timing, a test mode reset signal $\overline{FR}$ is set to be at an L level. On the other hand, as shown in FIG. 5, if these signals $\overline{RAS}$, $\overline{CAS}$ and $\overline{WE}$ are input at a CBR refresh timing or an ROR timing, a test mode reset signal $\overline{FR}$ is reset to be at an H level in response to rise of the row address strobe signal $\overline{RAS}$ to an H level.

In addition, as shown in FIG. 4, if these signals $\overline{RAS}$, $\overline{CAS}$ and $\overline{WE}$ are input at a WCBR timing, an address key latch control signal FSE is an H level for a prescribed time period after a prescribed time period has passed after the row address strobe signal $\overline{RAS}$ fell to an L level.

Furthermore, as shown in FIG. 4, if these signals $\overline{RAS}$, $\overline{CAS}$ and $\overline{WE}$ are input at a WCBR timing, a test mode activation signal FE attains an H level in response to rise of the row address strobe signal $\overline{RAS}$ to an H level. On the other hand, as shown in FIG. 5, if these signals $\overline{RAS}$, $\overline{CAS}$ and $\overline{WE}$ are input at a CBR refresh timing or an ROR timing, a test mode activation signal FE falls to an L level in response to rise of the row address strobe signal $\overline{RAS}$ to an H level.

Figure 6:
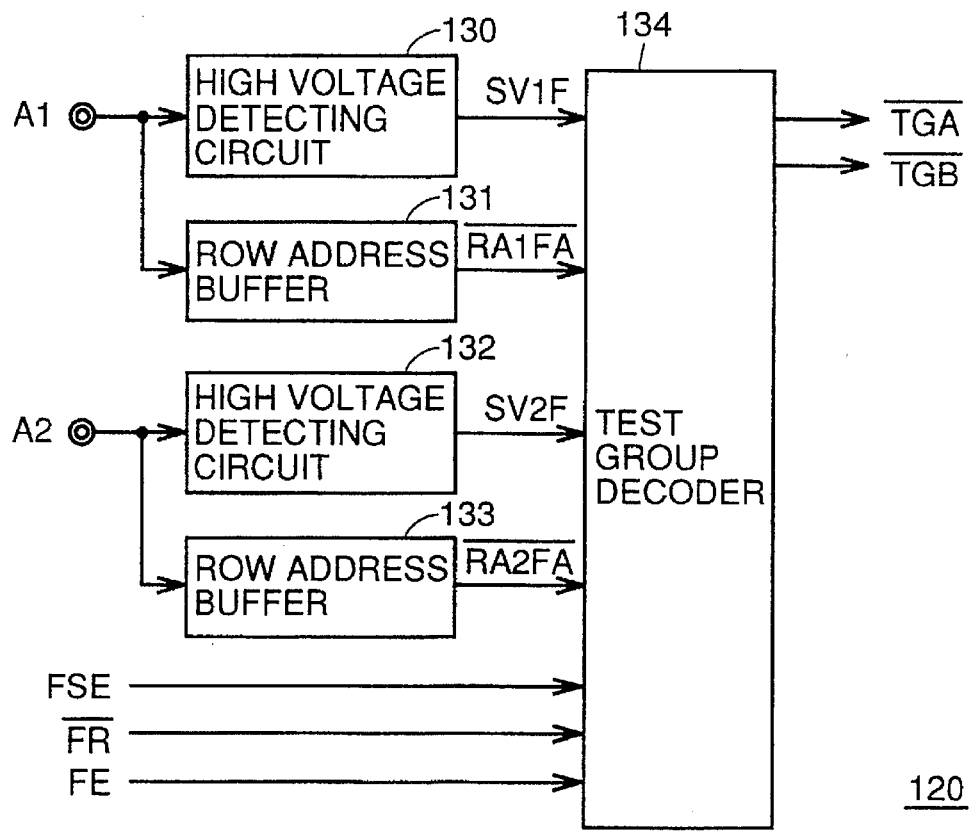
FIG. 6 is a block diagram showing an arrangement of a test group detecting circuit in FIG. 2.

(2.2) Test Group Detecting Circuit (FIG. 6)

FIG. 6 is a block diagram showing an arrangement of a test group detecting circuit 120 in FIG. 2. Referring to FIG. 6, this test group detecting circuit 120 includes high voltage detecting circuits 130 and 132, row address buffers 131 and 133, and a test group decoder 134. High voltage detecting circuit 130 detects whether voltage at an address pin A1 is at least at a super H level or not, and outputs a high voltage sense signal SV1F at an H level if the voltage is at least at a super H level. High voltage detecting circuit 132 operates in a manner similar to that of high voltage detecting circuit 130. Row address buffer 131 receives an address signal A1 and outputs an output signal $\overline{RA1FA}$. Row address buffer 133 operates in a manner similar to that of row address buffer 131. Test group decoder 134 takes high voltage sense signals SV1F and SV2F when an address latch control signal FSE is at an H level, and outputs special test group signals $\overline{TGA}$ and $\overline{TGB}$.

Figure 7:
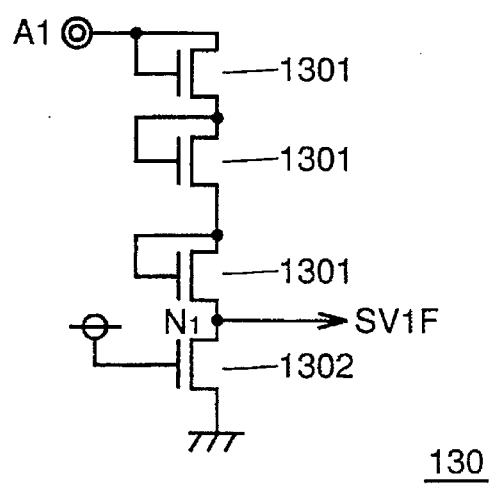
FIG. 7 is a circuit diagram showing an arrangement of a high voltage detecting circuit in FIG. 6.

(2.2.1) High Voltage Detecting Circuit (FIG. 7)

FIG. 7 is a circuit diagram showing an example of high voltage detecting circuit 130 in FIG. 6. Referring to FIG. 7, this high voltage detecting circuit 130 includes n diode-connected N channel MOS transistors 1301, and an N channel MOS transistor 1302. N channel MOS transistor 1301 has a threshold Vt. Accordingly, if voltage (at a super H level) which is higher than the power supply voltage Vcc by n×Vt is applied to address pin A1, a high voltage sense signal SV1F goes to a normal H level.

Figure 8:
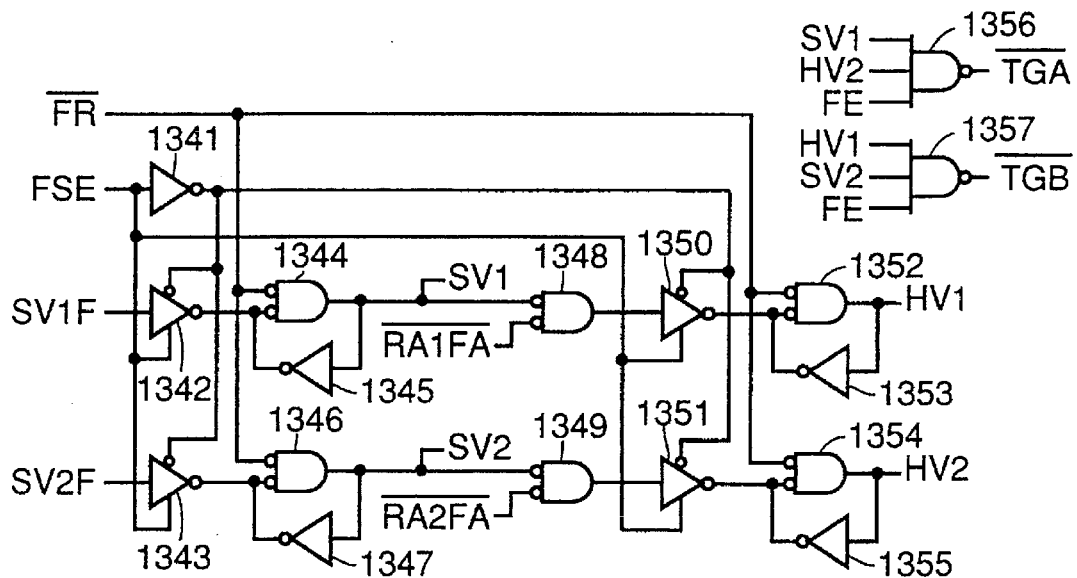
FIG. 8 is a circuit diagram showing an arrangement of a test group decoder in FIG. 6.

(2.2.2) Test Group decoder (FIG. 8)

FIG. 8 is a circuit diagram showing an arrangement of test group decoder 134 in FIG. 6. Referring to FIG. 8, this test group decoder 134 includes inverters 1341, 1345, 1347, 1353, and 1355, clocked inverters 1342, 1343, 1350 and 1351, NOR gates 1344, 1346, 1348, 1349, 1352 and 1354, and NAND gates 1356 and 1357. NOR gate 1344 and inverter 1345, NOR gate 1346 and inverter 1347, NOR gate 1352 and inverter 1353, and NOR gate 1354 and inverter 1355 constitute latch circuits, respectively.

Clocked inverters 1342, 1343, 1350 and 1351 operate in response to an address latch control signal FSE at an H level. Thus, an address key latch signal SV1 attains an H level when a high voltage sense signal SV1F is at an H level, and an address key latch signal SV2 attains an H level when a high voltage sense signal SV2F is at an H level. In addition, an address key latch signal HV1 attains an H level when an output signal $\overline{RA1FA}$ of row address buffer 131 is at an H level, and an address key latch signal HV2 attains an H level when an output signal $\overline{RA2FA}$ of row address buffer 133 is at an H level. Therefore, three states of voltage applied to an address pin can be sensed according to combinations of address key latch signals SV1, SV2, HV1, and HV2. For example, when an address key latch signal SVn (wherein n=1, 2) is at an H level and an address key latch signal HVn (wherein n=1, 2) is at an L level, voltage at an address pin is at a super H level. Furthermore, when an address key latch signal SVn is at an L level and an address key latch signal HVn is at an H level, voltage at an address pin is at a normal H level. In addition, if an address key latch signal SVn is at an L level and an address key latch signal HVn is at an L level, voltage at an address pin is at an L level. It is noted that address key latch signals SVn and HVn will not be at H levels simultaneously.

Special test group signals $\overline{TGA}$ and $\overline{TGB}$ are generated according to combinations of these address key latch signals SVn and HVn. A special test group signal $\overline{TGA}$ goes to an L level if a test mode activation signal FE and address key latch signals SV1 and HV2 are at H levels. A special test group signal $\overline{TGB}$ goes to an L level if a test mode activation signal FE and address key latch signals SV2 and HV1 are at H levels.

Accordingly, special test group signals $\overline{TGA}$ and $\overline{TGB}$ are activated if two kinds of voltages are applied to two address pins, respectively. If one of these two kinds of voltages is at an L level in a normal range of use, special test group signals $\overline{TGA}$ and $\overline{TGB}$ will not be activated even if the other kind of voltage is at a super H level. Furthermore, if one kind of voltages is applied to two address pins, special test group signals $\overline{\text{TGA}}$ and $\overline{\text{TGB}}$ will not be activated even if its level is any level. Accordingly, the semiconductor memory device will not enter into a special test mode even if high voltage is applied to an address pin by accident.

Figure 9:
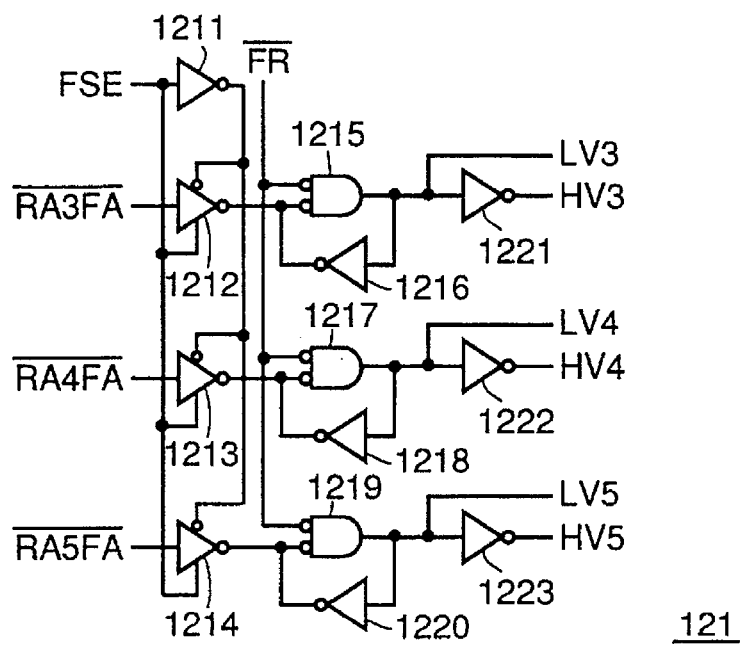
FIG. 9 is a circuit diagram showing an arrangement of an address key latch circuit in FIG. 2.

(2.3) Address Key Latch Circuit (FIG. 9)

FIG. 9 is a circuit diagram showing an arrangement of address key latch circuit 121 in FIG. 2. Referring to FIG. 9, this address key latch circuit 121 includes inverters 1211, 1216, 1218, 1220 and 1221–1223, clocked inverters 1212–1214, and NOR gates 1215, 1217 and 1219. NOR gate 1215 and inverter 1216, NOR gate 1217 and inverter 1218, and NOR gate 1219 and inverter 1220 constitute latch circuits, respectively.

This address key latch circuit 121 further includes three row address buffers (not shown) for receiving address key signals TA3–TA5 and outputting inverted signals $\overline{\text{RA3FA}}$–$\overline{\text{RA5FA}}$ thereof, respectively.

For a period during which an address latch control signal FSE is at an H level, output signals $\overline{\text{RA3FA}}$–$\overline{\text{RA5FA}}$ of these address buffers are introduced, so that address key latch signals HV3–HV5 and LV3–LV5 are latched. These signals continue to be latched until a test mode reset signal $\overline{\text{FR}}$ attains an H level. Furthermore, an output signal $\overline{\text{RAnFA}}$ (wherein n=3,4,5) of a row address buffer falls to an L level if a signal at an H level is applied to an address pin, and rises to an H level if a signal at an L level is applied to an address pin. Accordingly, if a signal at an H level is applied to an address pin, an address key latch signal HVn rises to an H level and an address key latch signal LVn falls to an L level. On the other hand, if a signal at an L level is applied to an address pin, an address key latch signal HVn falls to an L level and an address key latch signal LVn rises to an H level.

Figure 10:
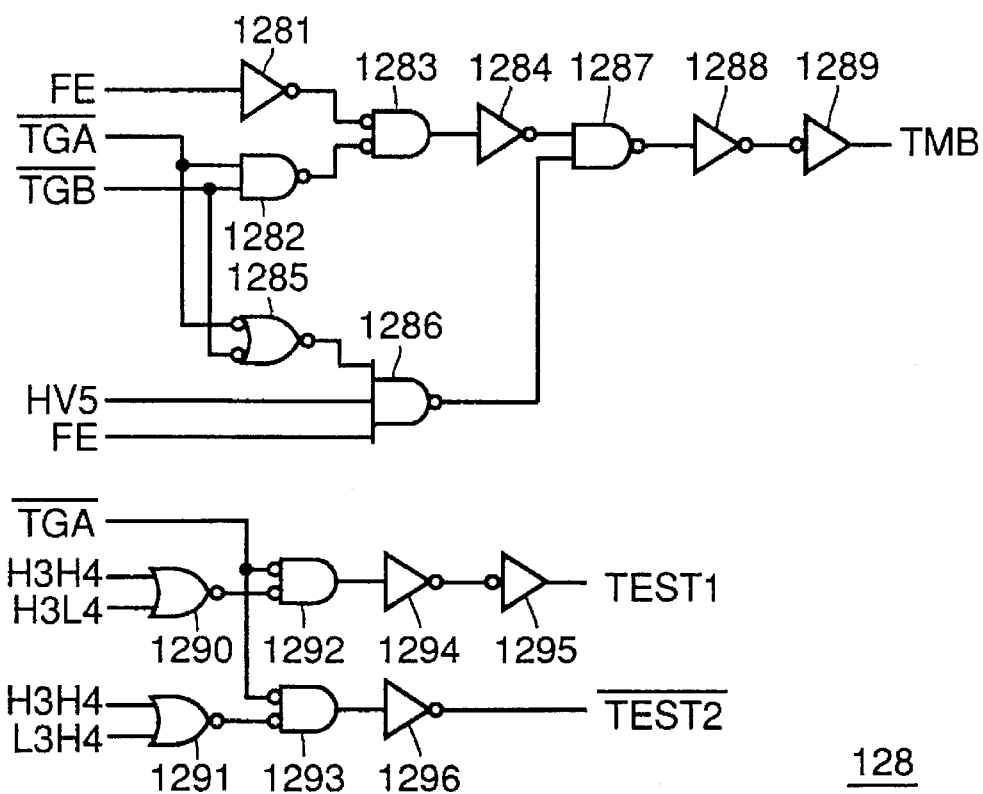
FIG. 10 is a circuit diagram showing an arrangement of a special test mode clock decoder in FIG. 2.

(2.4) Special Test Mode Clock Decoder (FIG. 10)

FIG. 10 is a circuit diagram showing an arrangement of special test mode clock decoder 128 in FIG. 2. Referring to FIG. 10, this special test mode clock decoder 128 includes a circuit for generating a multi-bit test activation signal TMB, and a circuit for generating a redundant row test activation signal TEST1 and a redundant column test activation signal $\overline{\text{TEST2}}$. This multi-bit test activation signal generating circuit includes inverters 1281, 1284, 1288 and 1289, NAND gates 1282, 1285, 1286 and 1287, and an NOR gate 1283. On the other hand, this redundant row and redundant column test activation signal generating circuit includes NOR gates 1290, 1291, 1292, and 1293, and inverters 1294, 1295 and 1296.

Whenever voltage at an L level in a normal range and voltage at a super H level are applied to address pins A1 and A2, respectively, and signals $\overline{\text{RAS}}$, $\overline{\text{CAS}}$ and $\overline{\text{WE}}$ are input at a WCBR timing, a multi-bit test activation signal TMB is activated, so that the semiconductor memory device will not enter into a special test mode. In addition, in carrying out property evaluation of this semiconductor memory device in a special test mode, time required for test can be reduced significantly if evaluation of margin of this semiconductor memory device is carried out in a multi-bit test mode. Accordingly, since a multi-bit test can be performed even in a special test mode, a multi-bit test mode can also be set by an address key. In the present embodiment, a multi-bit test can be performed when voltages at address pins A1, A2 and A5 are at a super H level, an H level and an H level, or at an H level, a super H level and an H level, respectively.

Figure 11:
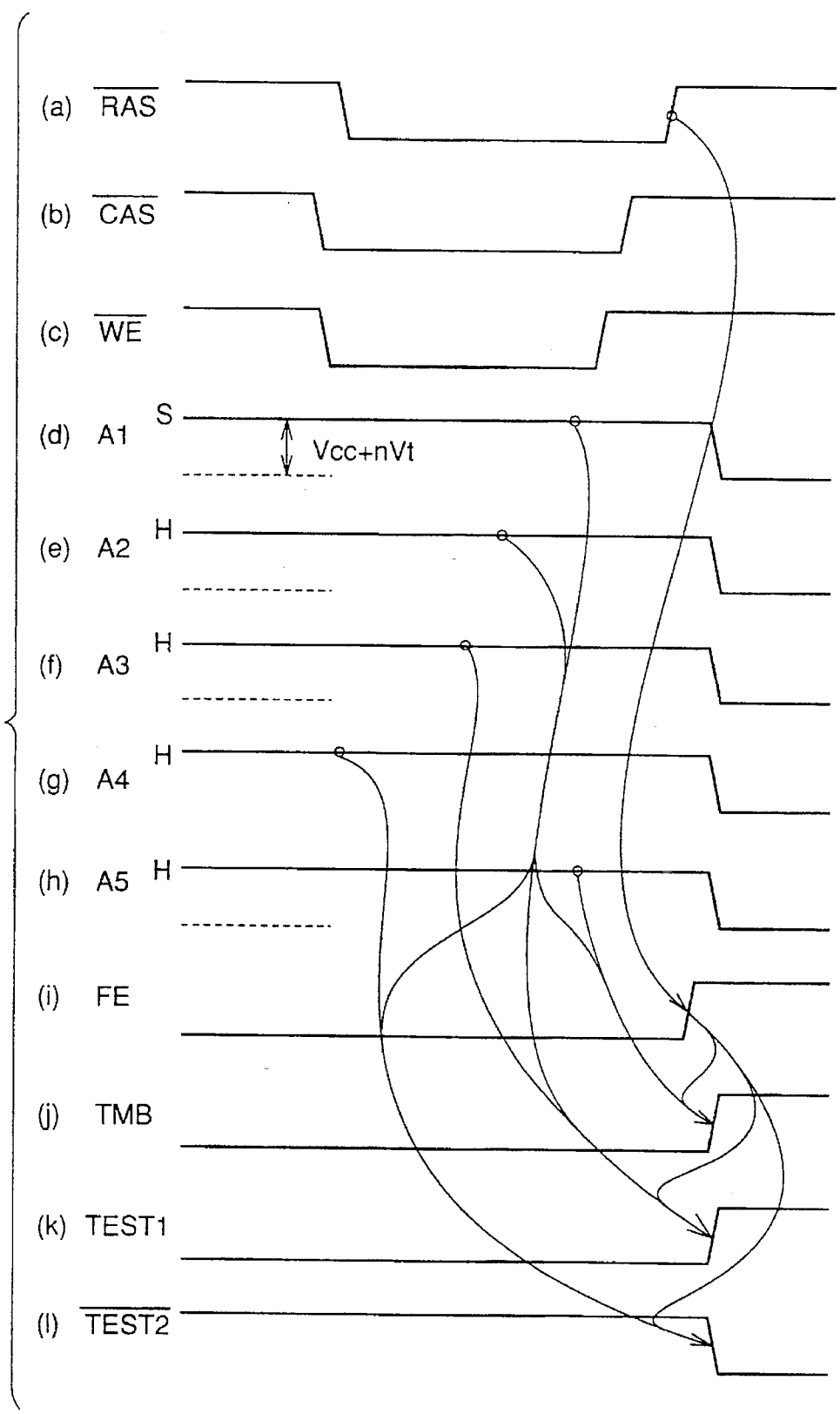
FIG. 11 is a timing chart showing a set operation by the test mode control circuit of FIG. 2.

FIG. 11 is a timing chart showing a set operation of a test mode control circuit in which all of a redundant row activation signal TEST1, a redundant column activation signal $\overline{\text{TEST2}}$ and a multi-bit test activation signal TMB are rendered in active states by a WCBR timing. In the case where voltage at a super H level (shown by S in FIG. 11) is applied to an address pin A1 and voltages at H levels are applied to address pins A2–A5 as shown in (d) to (h) of FIG. 11, if a row address strobe signal $\overline{\text{RAS}}$, a column address strobe signal $\overline{\text{CAS}}$ and a write enable signal $\overline{\text{WE}}$ are input at a WCBR timing as shown in (a) to (c) of FIG. 11, an address key latch signal SV1 rises to an H level, an address key latch signal HV1 falls to an L level, an address key latch signal SV2 falls to an L level, an address key latch signal HV2 rises to an H level, an address key latch signal HV3 rises to an H level, an address key latch signal LV3 falls to an L level, an address key latch signal HV4 rises to an H level, an address key latch signal LV4 falls to an L level, an address key latch signal HV5 rises to an H level, and an address key latch signal LV5 falls to an L level. Thus, a special test group signal $\overline{\text{TGA}}$ is ready for being in an active state.

These address key latch signals are pre-decoded by address key pre-decoder 123, and further decoded by special test mode clock decoder 128. Then, when a test mode activation signal FE rises in response to rise of a row address strobe signal $\overline{\text{RAS}}$, a special test group signal $\overline{\text{TGA}}$ are rendered in an active state (at an L level), so that a redundant row test activation signal TEST1, a redundant column test activation signal $\overline{\text{TEST2}}$ and a multi-bit test activation signal TMB are sequentially rendered in active states.

Figure 12:
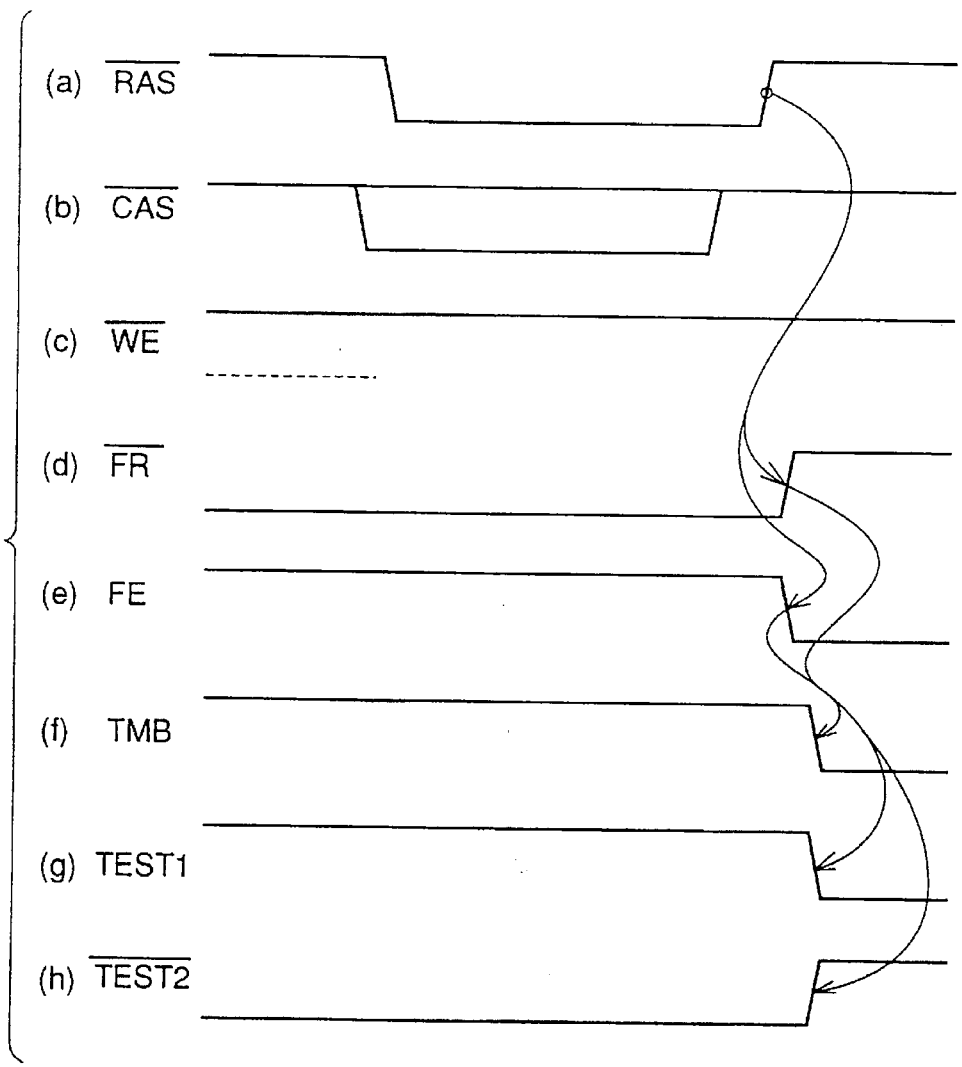
FIG. 12 is a timing chart showing a reset operation by the test mode control circuit of FIG. 2.

FIG. 12 is a timing chart showing a reset operation of the test mode control circuit, in which all of a redundant row test activation signal TEST1, a redundant column test activation signal $\overline{\text{TEST2}}$ and a multi-bit test activation signal TMB are rendered in inactive states by an ROR or a CBR refresh timing. If a row address strobe signal $\overline{\text{RAS}}$, a column address strobe signal $\overline{\text{CAS}}$ and a write enable signal $\overline{\text{WE}}$ are input at an ROR or a CBR refresh timing and the row address strobe signal $\overline{\text{RAS}}$ then rises as shown in (a)–(c) of FIG. 12, a test mode reset signal $\overline{\text{FR}}$ attains an H level as shown in (d) of FIG. 12. When the test mode reset signal $\overline{\text{FR}}$ attains an H level, all the address key latch signals fall to L levels, and therefore, a test mode activation signal FE also falls to an L level as shown in (e) of FIG. 12. Therefore, all of the redundant test activation signal TEST1, the redundant column test activation signal $\overline{\text{TEST2}}$ and the multi-bit test activation signal TMB are rendered in inactive states as shown in (f) to (h) of FIG. 12.

According to the foregoing description, the decoded signal table of test mode control circuit 112 is as shown in the following Table 1. In the Table 1, S indicates a super H level, H indicates a normal H (logic high) level, and L indicates an L (logic low) level.

TABLE 1

| Group | A1 | A2 | A3 | A4 | A5 | |
|---|---|---|---|---|---|---|
| A | S | H | H | L | L | TEST1 |
| | S | H | H | L | H | TEST1, TMB |
| | S | H | L | H | L | $\overline{\text{TEST2}}$ |
| | S | H | L | H | H | $\overline{\text{TEST2}}$, TMB |
| | S | H | H | H | L | TEST1, $\overline{\text{TEST2}}$ |
| | S | H | H | H | H | TEST1, $\overline{\text{TEST2}}$, TMB |
| | S | H | L | L | H | TMB |
| B | H | S | L | L | H | TMB |

Although a special test mode which can be set with a special test group signal $\overline{\text{TGB}}$ is a multi-bit test mode only, a special test mode other than the multi-bit test mode may be set. Needless to say, combinations of address keys can be set arbitrarily.

Figure 13:
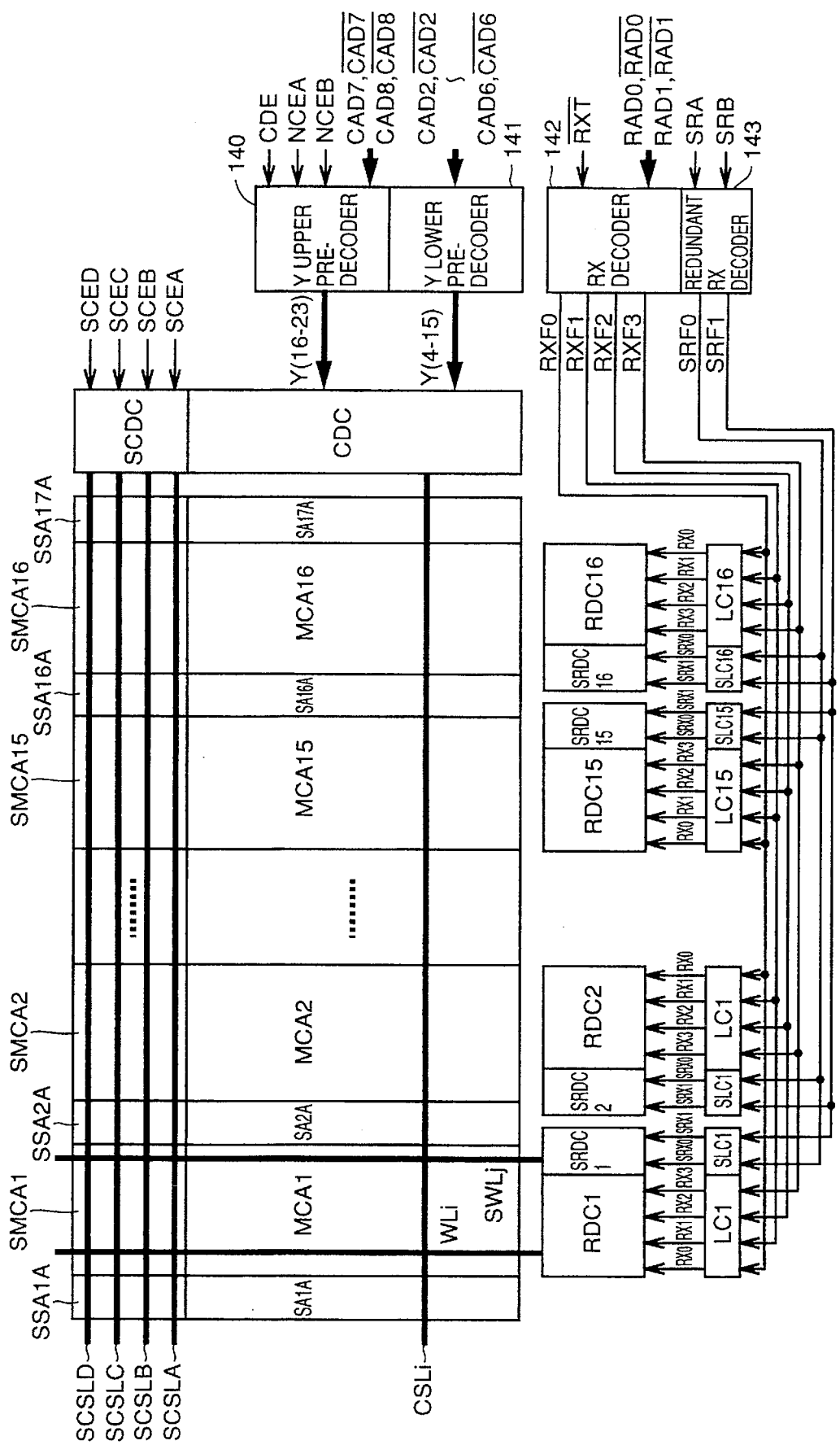
FIG. 13 is a block diagram showing an arrangement of a memory cell array, a redundant row memory cell array, a redundant column memory cell array and a redundant column row memory cell array in FIG. 1 as well as peripheral circuits thereof.
Figure 14:
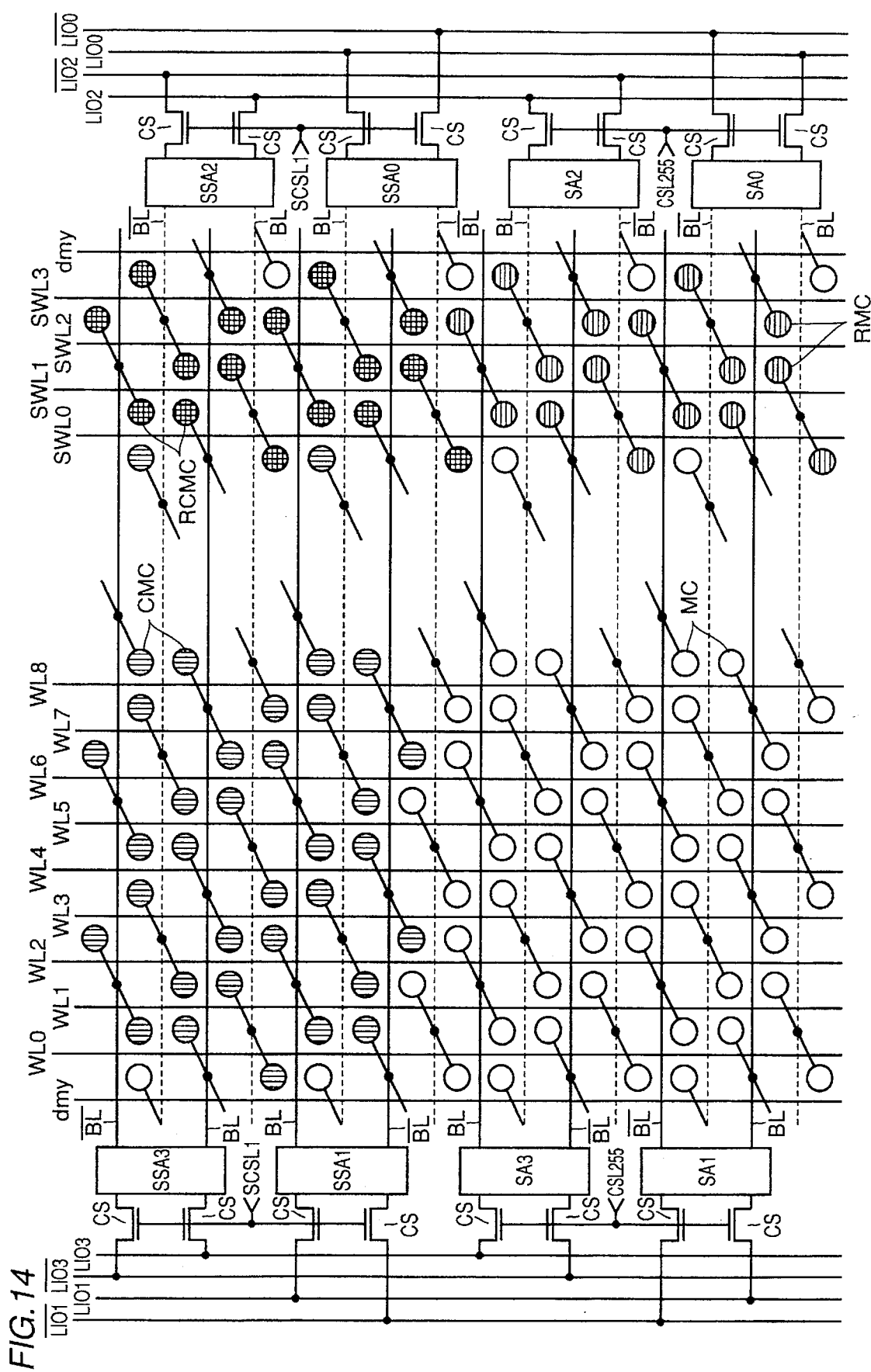
FIG. 14 is an interconnection diagram showing an arrangement of each memory cell array block in FIG. 13.

(3) Memory Cell Array and Peripheral Circuits Thereof (FIG. 13, FIG. 14)

FIG. 13 is a block diagram showing in detail an arrangement of memory cell arrays 100–103 and peripheral circuits thereof in FIG. 1. Referring to FIG. 13, memory cell array 100 and redundant row memory cell array 101 in FIG. 1 are divided into 16 memory cell array blocks MCA1–MCA16. Redundant column memory cell array 102 and redundant column row memory cell array 103 in FIG. 1 are divided into 16 redundant column memory cell array blocks SMCA1–SMCA16. Sense refresh amplifier I/O control circuit 104 in FIG. 1 is divided into 17 sense refresh amplifier I/O control circuit blocks SA1A–SA17A. Redundant sense refresh amplifier I/O control circuit 105 in FIG. 1 is divided into 17 redundant sense refresh amplifier I/O control circuit blocks SSA1A–SSA17A.

Row decoder 106 in FIG. 1 includes 16 row decoders RDC1–RDC16 and 16 level converting circuits LC1–LC16. Redundant row decoder 107 in FIG. 1 includes 16 redundant row decoders SRDC1–SRDC16 and 16 redundant level converting circuits SLC1–SLC16. Row decoders RDC1–RDC16 and redundant row decoders SRDC1–SRDC16 are located respectively corresponding to memory cell arrays MCA1–MCA16. Each of row decoders RDC1–RDC16 is connected to four normal word lines WLi, and drives one of these four normal word lines in response to word line driving signals RX0–RX3. Each of redundant row decoders SRDC1–SRDC16 is connected to two redundant word lines SWLj, and drives one of these two redundant word lines in response to redundant word line driving signals SRX0 and SRX1.

Each of level converting circuits LC1–LC16 converts word line driving signals RXF0–RXF3 at power supply voltage levels into word line driving signals RX0–RX3 at boosted voltage levels, respectively, and supplies these converted word line driving signals to a corresponding row decoder. Each of redundant level converting circuits SLC1–SLC16 converts redundant word line driving signals SRF0 and SRF1 at the power supply voltage levels to redundant word line driving signals SRX0 and SRX1 at boosted voltage levels, respectively, and supplies these converted redundant word line driving signals to a corresponding redundant row decoder.

Word line driving signals RXF0–RFX3 are generated by an RX decoder 142 shown in FIG. 13. Redundant word line driving signals SRF0 and SRF1 are generated by a redundant RX decoder 143 shown in FIG. 13. RX decoder 142 is activated in response to an RX decoder activation signal $\overline{RXT}$, so that one word line driving signal is generated according to complementary row address signals RAD0, $\overline{RAD0}$ and RAD1, $\overline{RAD1}$. An RC decoder activation signal $\overline{RXT}$ is generated by delaying a row address strobe signal $\overline{RAS}$. In addition, redundant RX decoder 143 generates one redundant word line driving signal according to redundant row address sense signals SRA and SRB.

Column decoder 108 in FIG. 1 includes a Y upper pre-decoder 140, a Y lower pre-decoder 141, and a column decoder CDC shown in FIG. 13. Y lower pre-decoder 141 generates pre-decode signals Y4–Y15 by pre-decoding complementary column address signals CAD2, $\overline{CAD2}$–CAD6, $\overline{CAD6}$. Y upper pre-decoder 140 is activated in response to a column decoder activation signal CDE and normal column activation signals NCEA and NCEB, and generates pre-decode signals Y16–Y23 by pre-decoding complementary column address signals CAD7, $\overline{CAD7}$ and CAD8, $\overline{CAD8}$. Column decoder CDC activates one of column selection lines CSLi in response to these pre-decode signals Y4–Y23.

A redundant column decoder SCDC is connected to four redundant column selection lines SCSLA, SCSLB, SCSLC and SCSLD, and activates two redundant column selection lines in response to four redundant column activation signals SCEA, SCEB, SCEC and SCED. Since redundant column activation signals SCEA and SCEC herein attain H levels simultaneously, corresponding redundant column selection lines SCSLA and SCSLC are activated simultaneously. Furthermore, since redundant column activations signals SCEB and SCED attain H levels simultaneously, corresponding redundant column selection lines SCSLB and SCSLD are activated simultaneously.

FIG. 14 is an interconnection diagram showing one block out of blocks MCA1, SMCA1, SA1A, SSA1A–MCA16, SMCA16, SA17A and SSA17A in FIG. 13. Referring to FIG. 14, a plurality of bit line pairs BL and $\overline{BL}$ are located across a plurality of word lines WL0–WL8 and four redundant word lines SWL0–SWL3.

A plurality of normal memory cells MC are located respectively corresponding to intersections of normal bit line pairs BL and $\overline{BL}$ and normal word line WL0–WL8. A normal memory cell MC is indicated by ○. In addition, a plurality of redundant row memory cells RMC are located respectively corresponding to intersections of normal bit line pairs BL and $\overline{BL}$ and redundant word lines SWL0–SWL3. A redundant row memory cell RMC is indicated by ⊖. Furthermore, a plurality of redundant column memory cells CMC are located respectively corresponding to intersections of redundant bit line pairs BL and $\overline{BL}$ and normal word lines WL0–WL8. A redundant column memory cell CMC is indicated by ⊕. In addition, a plurality of redundant row column memory cells RCMC are located respectively corresponding to intersections of redundant bit line pairs BL and $\overline{BL}$ and redundant word lines SWL0–SWL3. A redundant row column memory cell RCMC is indicated by ⊕.

A plurality of normal sense refresh amplifiers SA0–SA3 are located corresponding to a plurality of normal bit line pairs BL and $\overline{BL}$. In addition, a plurality of redundant sense refresh amplifiers SSA0–SSA3 are located corresponding to redundant bit line pairs BL and $\overline{BL}$.

Two local I/O line pairs LIO1, $\overline{LIO1}$ and LIO3, $\overline{LIO3}$ are located on one side of such a memory cell array, and two local I/O line pairs LIO0, $\overline{LIO0}$, and LIO2, $\overline{LIO2}$ are located on the other side thereof. Two column selection gates CS are located corresponding to each of normal sense refresh amplifiers SA0–SA3. In addition, two redundant column selection gates CS are placed corresponding to each of redundant sense refresh amplifiers SSA0–SSA3.

One normal column selection line CSL255 is located corresponding to four normal sense refresh amplifiers SA0–SA3, and one redundant column selection line SCSL1 is located corresponding to four redundant sense refresh amplifiers SSA0–SSA3.

A dummy word line dmy having the same shape as that of a word line WL0 is located along the word line WL0, and a dummy word line dmy having the same shape as that of a redundant word line SWL3 is located along the redundant word line SWL3.

Figure 15:
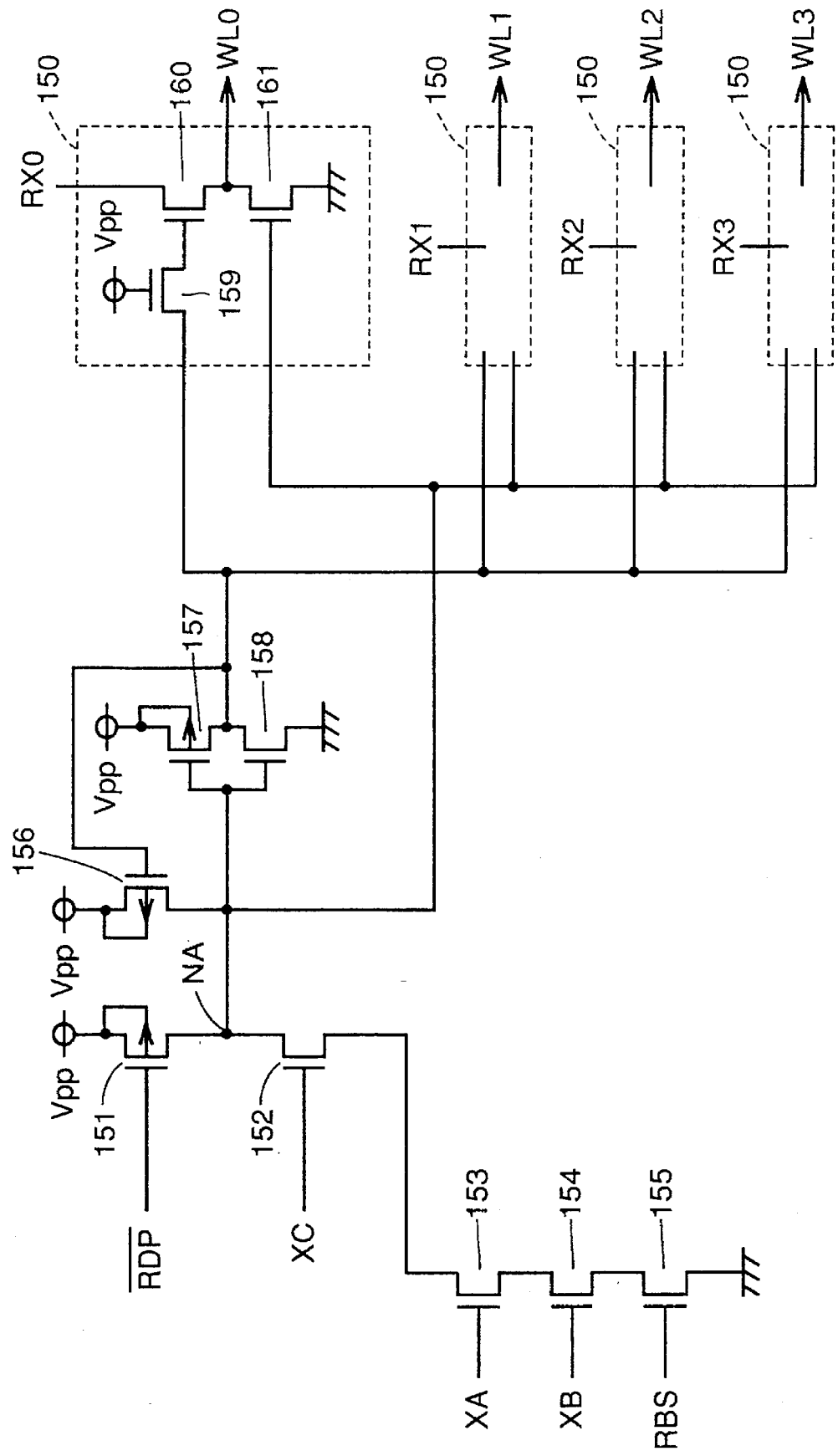
FIG. 15 is a circuit diagram showing an arrangement of each row decoder in FIG. 13.

(4) Row System Circuit (4.1) Row Decoder (FIG. 15)

FIG. 15 is a circuit diagram showing an arrangement of one of row decoders RDC1–RDC16 in FIG. 13. Referring to FIG. 15, one row decoder includes four driving circuits 150 respectively connected to four corresponding word lines WL0–WL3, N channel MOS transistors 152–155 and 158, and P channel MOS transistors 151, 156 and 157. Each driving circuit 150 includes N channel MOS transistors 159–161. A row decoder precharge signal $\overline{RDP}$ is applied to a gate electrode of P channel MOS transistor 151. A block select signal RBS is applied to a gate electrode of N channel MOS transistor 155. X pre-decode signals XC, XA and XB are applied to gate electrodes of N channel MOS transistors 152–154, respectively.

If a row decoder precharge signal $\overline{RDP}$ falls to an L level during a precharge period for rows, a node NA is precharged to a boosted voltage Vpp level. Thus, all the word lines WL0–WL3 are rendered in inactive states. Then, if a row address strobe signal $\overline{RAS}$ falls to an L level, the row decoder precharge signal $\overline{RDP}$ attains an H level, and therefore, a specific row decoder is selected according to combination of the block select signal RBS and the X pre-decode signals XA–XC. Then, a corresponding one word line is selected in response to selectively supplied word line activation signals RX0–RX3. For example, if a word line driving signal RX0 is supplied, voltage at a corresponding word line WL0 increases to a boosted voltage Vpp level.

Figure 16:
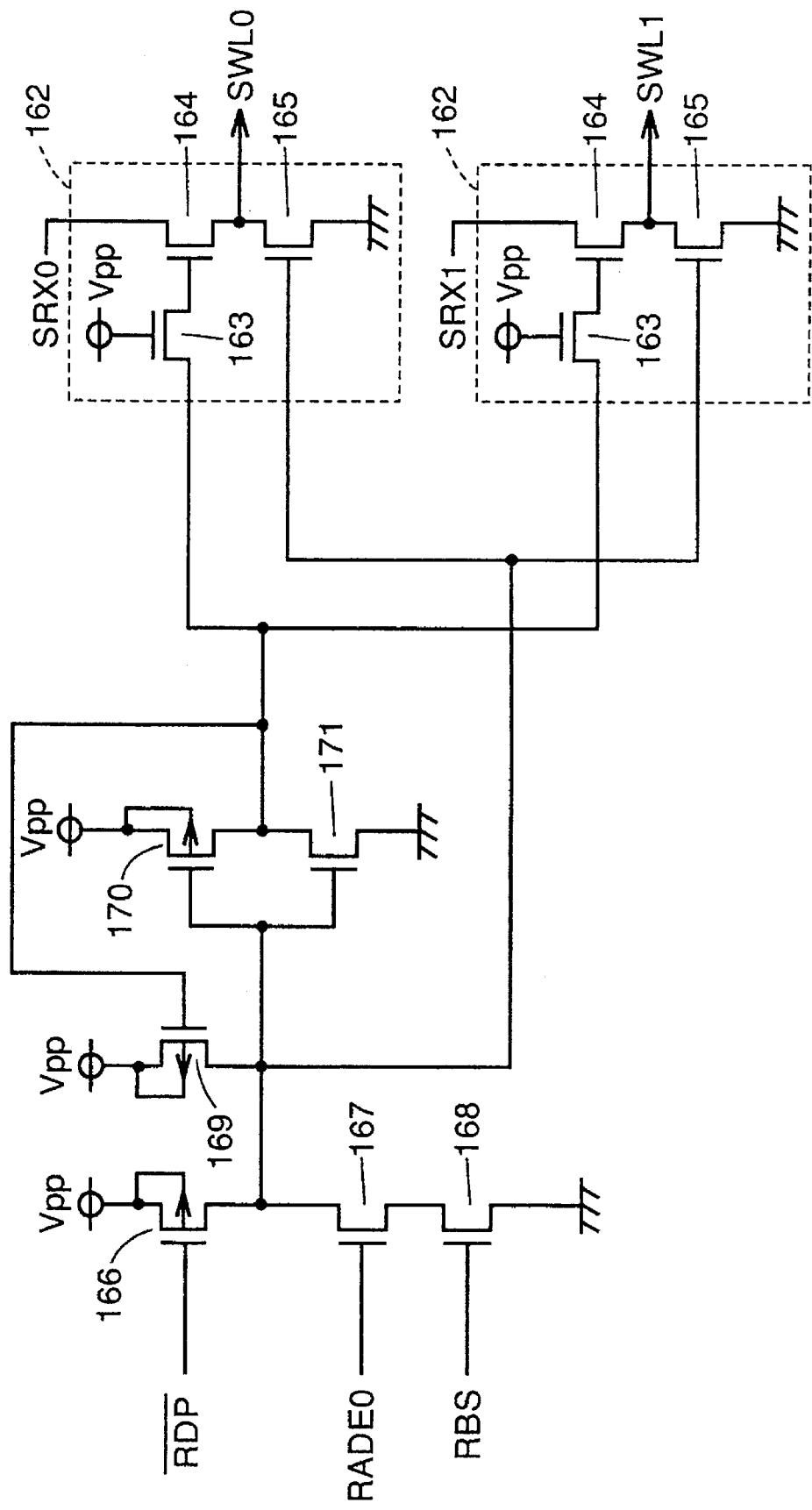
FIG. 16 is a circuit diagram showing an arrangement of each redundant row decoder in FIG. 13.

(4.2) Redundant Row Decoder (FIG. 16)

FIG. 16 is a circuit diagram showing an arrangement of one of redundant row decoders SRDC1–SRDC16 in FIG. 13. Referring to FIG. 16, one redundant row decoder includes two driving circuits 162 respectively connected to two corresponding redundant word lines SWL0 and SWL1, N channel MOS transistors 167, 168 and 171, and P channel MOS transistors 166, 169 and 170. Each driving circuit 162 includes N channel MOS transistors 163–165. A signal RADE0 indicating an even number or an odd number is applied to a gate electrode of N channel MOS transistor 167. Redundant row decoders SRDC1–SRDC16 operate in an approximately similar manner to that of normal decoders RDC1–RDC16. In the case of selecting a normal word line, since both redundant word line driving signals SRX0 and SRX1 are kept at L levels, redundant word lines SWL0 and SWL1 will not be activated. However, if a redundant row address sensing circuit which will be described below senses agreement of an externally applied row address signal with a programmed substitute address, one of redundant row address sense signals SRA and SRB attains an H level, and RX decoder 142 is deactivated. Therefore, all the normal word line driving signals RXF0–RXF3 fall to L levels. On the other hand, when a redundant row address sense signal SRA attains an H level, a corresponding redundant word line driving signal SRF0 attains an H level, and when a redundant row address sense signal SRB attains an H level, a corresponding redundant word line driving signal SRF1 attains an H level. Therefore, four redundant word lines in a selected memory cell array block are activated two by two in response to a signal RADE0.

Figure 17:
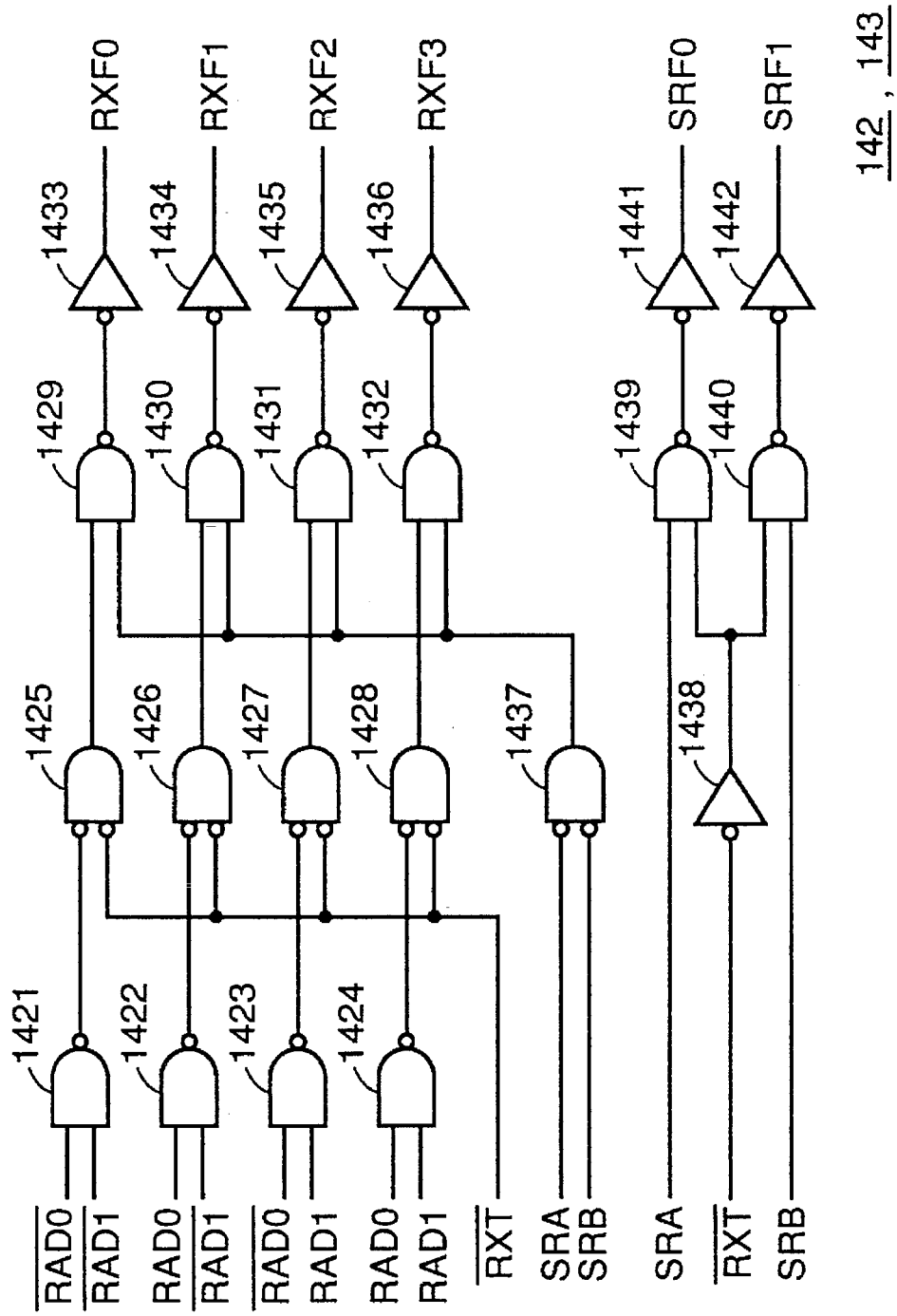
FIG. 17 is a circuit diagram showing an arrangement of an RX decoder and a redundant RX decoder in FIG. 13.

(4.3) RX Decoder and Redundant RX Decoder (FIG. 17)

FIG. 17 is a circuit diagram showing an arrangement of RX decoder 142 and redundant RX decoder 143 in FIG. 13. Referring to FIG. 17, RX decoder 142 includes NAND gates 1421–1424 and 1429–1432, NOR gates 1425–1428, and inverters 1433–1436. An NOR gate 1437 for receiving redundant row address sense signals SRA and SRB is connected to one input node of each of NAND gates 1429–1432.

Accordingly, this RX decoder 142 is activated when both redundant row address sense signals SRA and SRB are at L levels. If an RX decoder activation signal $\overline{RXT}$ falls to an L level, one of word line driving signals RXF0–RXF3 is activated to an H level in response to row address signals $\overline{RAD0}$, $\overline{RAD1}$; RAD0, $\overline{RAD1}$; $\overline{RAD0}$, RAD1; and RAD0, RAD1 respectively applied to NAND gates 1421–1424.

Redundant RX decoder 143 includes inverters 1438, 1441 and 1442 and NAND gates 1439 and 1440. Accordingly, if a redundant row address sense signal SRA attains an H level, a corresponding redundant word line driving signal SRF0 is activated to an H level in response to an RX decoder activation signal $\overline{RXT}$. Since this redundant row address sense signal SRA at an H level is also applied to NOR gate 1437, RX decoder 142 is deactivated. On the other hand, if a redundant row address sense signal SRB attains an H level, a corresponding redundant word line driving signal SRF1 is activated to an H level in response to an RX decoder activation signal $\overline{RXT}$. Since this redundant row address sense signal SRB at an H level is also applied to NOR gate 1437, RX decoder 142 is deactivated.

Figure 18:
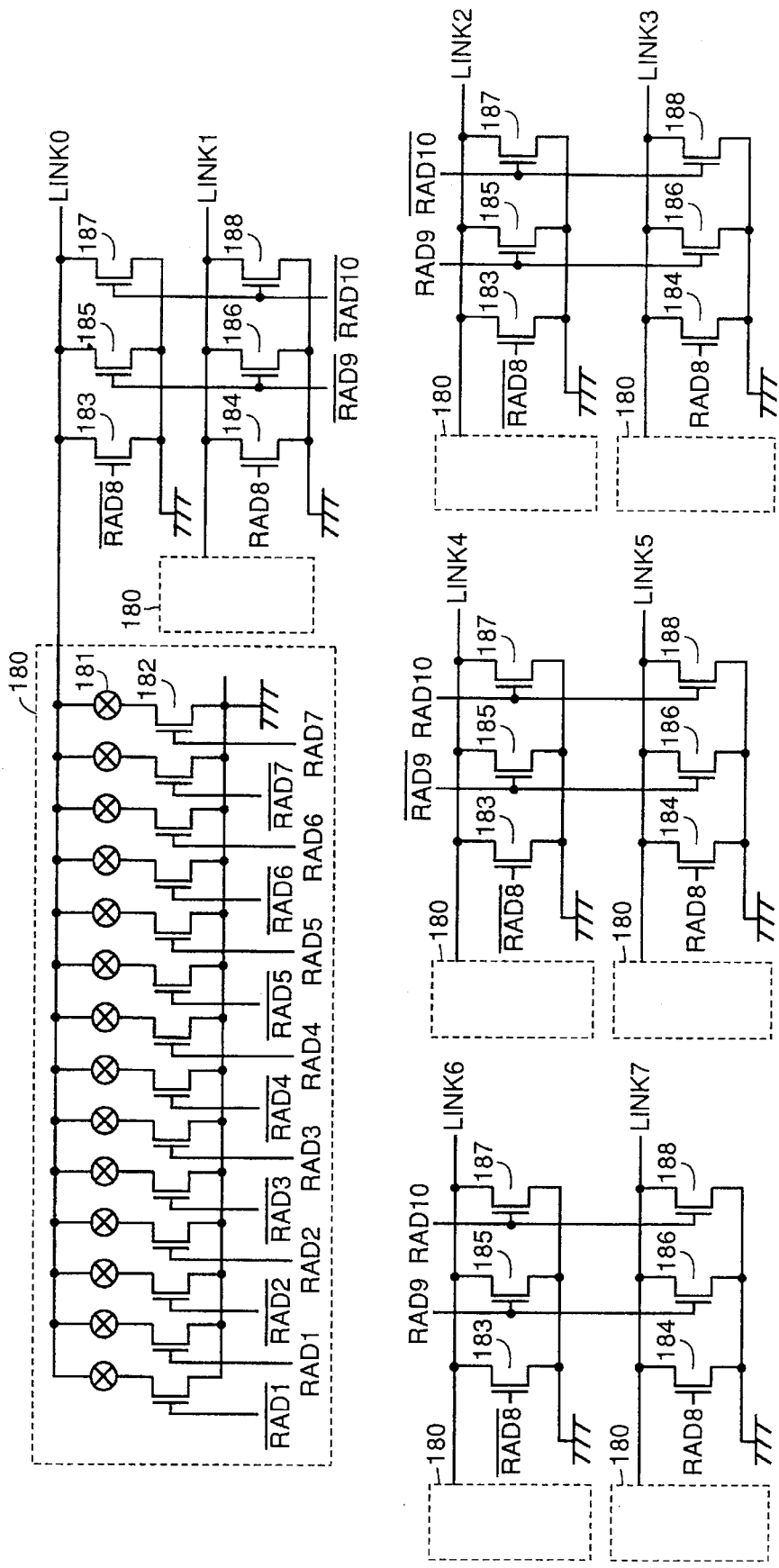
FIG. 18 is a circuit diagram showing an arrangement of a redundant row address program circuit included in a redundant memory control circuit in FIG. 1.
Figure 19:
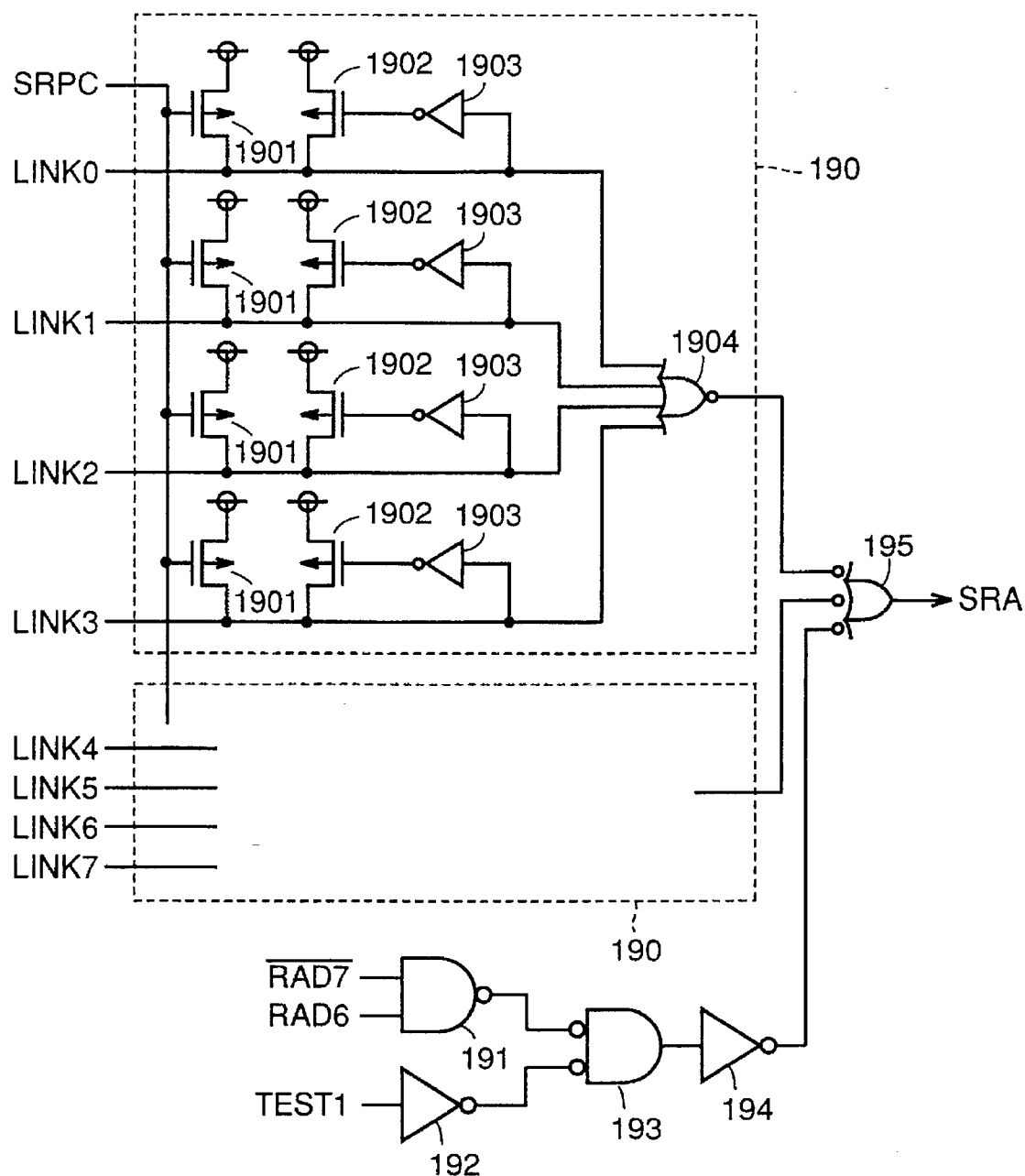
FIG. 19 is a circuit diagram showing an arrangement of a redundant row address sensing circuit included in the redundant memory control circuit in FIG. 1.
Figure 20:
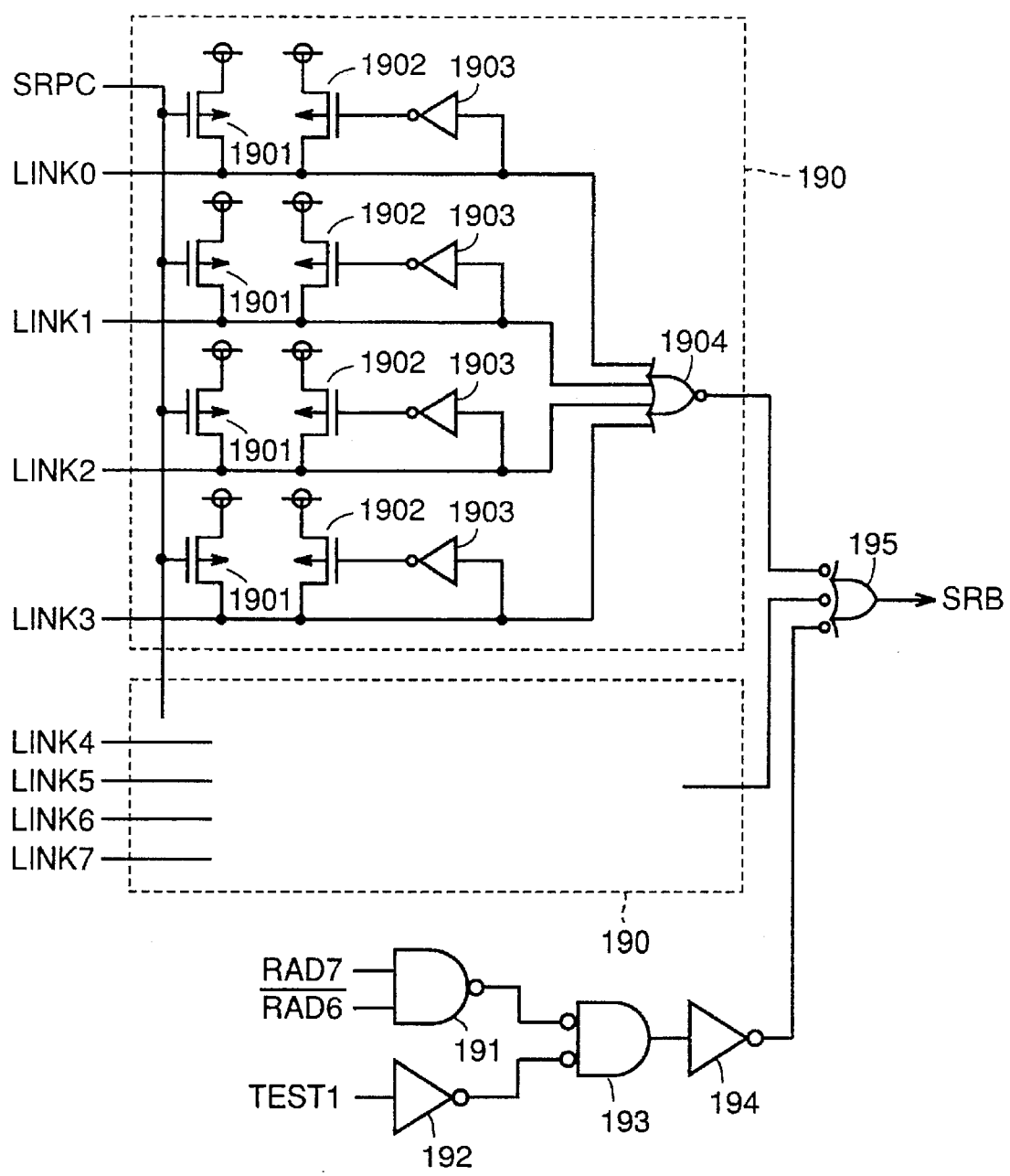
FIG. 20 is a circuit diagram showing an arrangement of another redundant row address sensing circuit included in the redundant memory control circuit in FIG. 1.

(4.4) Redundant Row Address Program Circuit and Redundant Row Address Sensing Circuit (FIGS. 18–20)

FIG. 18 is a circuit diagram showing an arrangement of a redundant row address program circuit included in redundant memory control circuit 113 of FIG. 1. Referring to FIG. 18, this redundant row address program circuit includes 8 program portions 180. Each program portion 180 includes 14 fuse elements 181 connected in common with a single signal line for a link signal, and 14 N channel MOS transistors 182 each connected in series with a corresponding fuse element 181. Row address signals RAD1, $\overline{RAD1}$–RAD7, $\overline{RAD7}$ are applied to gate electrodes of these N channel MOS transistors 182, respectively.

Three N channel MOS transistors 183, 185 and 187 or 184, 186 and 188 are connected between each link signal line and a ground node. A row address signal $\overline{RAD8}$ is applied to each of gate electrodes of N channel MOS transistors 183. A row address signal RAD8 is applied to each of gate electrodes of N channel MOS transistors 184. A row address signal $\overline{RAD9}$ is applied to gate electrodes of N channel MOS transistors 185 and 186 corresponding to link signals LINK0 and LINK1, respectively. A row address signal $\overline{RAD10}$ is applied to gate electrodes of N channel MOS transistors 187 and 188 corresponding to link signals LINK0 and LINK1, respectively. A row address signal RAD9 is applied to gate electrodes of N channel MOS transistors 185 and 186 corresponding to link signals LINK2 and LINK3, respectively. A row address signal $\overline{RAD10}$ is applied to gate electrodes of N channel MOS transistors 187 and 188 corresponding to link signals LINK2 and LINK3, respectively. A row address signal $\overline{RAD9}$ is applied to gate electrodes of N channel MOS transistors 185 and 186 corresponding to link signals LINK4 and LINK5, respectively. A row address signal RAD10 is applied to gate electrodes of N channel MOS transistors 187 and 188 corresponding to link signals LINK4 and LINK5, respectively. A row address signal RAD9 is applied to gate electrodes of N channel MOS transistors 185 and 186 corresponding to link signals LINK6 and LINK7, respectively. A row address signal RAD10 is applied to gate electrodes of N channel MOS transistors 187 and 188 corresponding to link signals LINK6 and LINK7, respectively.

FIG. 19 is a circuit diagram showing an arrangement of a first redundant row address sensing circuit included in redundant memory control circuit 113 of FIG. 1.

This redundant row address sensing circuit is provided corresponding to the redundant row address program circuit shown in FIG. 18. Referring to FIG. 19, this redundant row address sensing circuit includes two sensing portions 190. Each sensing portion 190 includes P channel MOS transistors 1901 and 1902, inverters 1903 and an NOR gate 1904. This redundant row address sensing circuit further includes an NAND gate 191, inverters 192 and 194, and an NOR gate 193. Row address signals RAD6 and $\overline{RAD7}$ are applied to NAND gate 191, a redundant row test activation signal TEST1 is applied to inverter 192.

This redundant row address sensing circuit further includes an NAND gate 195 for receiving outputs of two NOR gates 1904 and an output of inverter 194. This NAND gate 195 outputs a redundant row address sense signal SRA.

FIG. 20 is a circuit diagram showing an arrangement of a second redundant row address sensing circuit included in redundant memory control circuit 113 of FIG. 1. This redundant row address sensing circuit is provided corresponding to another redundant row address program circuit included in redundant memory control circuit 113. Referring to FIG. 20, the second redundant row address sensing circuit is constituted in a manner similar to that of the first redundant row address sensing circuit shown in FIG. 19. However, row address signals $\overline{RAD6}$ and RAD7 are applied to an NAND gate 191 in the second redundant row address sensing circuit. In addition, an NAND gate 195 outputs a redundant row address sense signal SRB.

A redundant row precharge signal SRPC shown in FIGS. 19 and 20 falls to an L level in response to rise of a row address strobe signal $\overline{RAS}$, so that all the signal lines for link signals LINK0-LINK7 are precharged to power supply voltage Vcc levels. Therefore, both redundant row address sense signals SRA and SRB attain H levels.

In a condition where all the fuse elements 181 shown in FIG. 18 have not been blown, that is, in a condition where no substitute addresses have been programmed at all, all the link signals LINK0-LINK7 fall to L levels whatever address signal is applied. On the other hand, in a condition where fuse elements 181 each corresponding to one row address signal of each of complementary row address signal pairs RAD1, $\overline{RAD1}$-RAD7, $\overline{RAD7}$ are blown, that is, in a condition where substitute addresses have been programmed, all the link signals LINK0-LINK7 fall to L levels if an address which is not programmed is applied, and link signals LINK0-LINK7 are kept at H levels if a programmed address is applied. This is because, with fuse element 181 being blown, a signal line for a link signal will not be discharged even if N channel MOS transistor 182 corresponding to that fuse element 181 is turned on.

As described above, if a semiconductor memory device is not set to a redundant row test mode (a redundant row test activation signal TEST1 is at an L level), one of redundant row address sense signals SRA and SRB is activated and the other is deactivated in response to link signals LINK0-LINK7. Accordingly, one of redundant row address sense signals SRA and SRB falls to an L level if an address signal which is not programmed is applied, whereas one of redundant row address sense signals SRA and SRB is kept at an H level if a programmed address signal is applied.

An operation of the case where a semiconductor memory device is set to a redundant row test mode (a redundant row test activation signal TEST1 is at an H level) will now be described. In this case, if both row address signals $\overline{RAD7}$ and RAD6 applied to NAND gate 191 in FIG. 19 are at H levels, a redundant row address sense signal SRA is activated to an H level, regardless of link signals LINK0-LINK7. At this time, since row address signals RAD7 and $\overline{RAD6}$ at L levels are applied to NAND gate 191 in FIG. 20, a redundant row address sense signal SRB is deactivated to an L level.

On the other hand, if both row address signals RAD7 and $\overline{RAD6}$ applied to NAND gate 191 in FIG. 20 are at H levels, a redundant row address sense signal SRB is activated to an H level. At this time, since row address signals $\overline{RAD7}$ and RAD6 at L levels are applied to NAND gate 191 in FIG. 19, a redundant row address sense signal SRA is deactivated to an L level.

In this case, complementary row address signals RAD6, $\overline{RAD6}$ and RAD7, $\overline{RAD7}$ used in program portion 180 is also used for sensing such a redundant test mode, since an address to be programmed will not be necessary by forcibly activating redundant row address sense signals SRA and SRB. Accordingly, since redundant RX decoder 143 for selecting redundant row address sense signals SRA and SRB according to the address which will be unnecessary is provided, a functional test of all the redundant row memory cells except a redundant row memory cell located at an intersection of a redundant row and a redundant column can be carried out by combination of an externally applied address.

Although an example in which two redundant row address sense signals SRA and SRB are used has been described in the present embodiment, 7 row addresses RAD1-RAD7 for program are used herein, and therefore, $2^7$ redundant row address sense signals can be activated selectively according to these externally applied addresses. However, an arrangement in which the number of redundant row address sense signals used is the same as that of main clocks applied to a redundant row decoder is optimum. This is because such an arrangement will not require additional control signals, and will not result in increase in area for a repeating circuit subjected to largest restriction on layout area, such as a row decoder, a redundant row decoder, a column decoder and a redundant column decoder.

Figure 21:
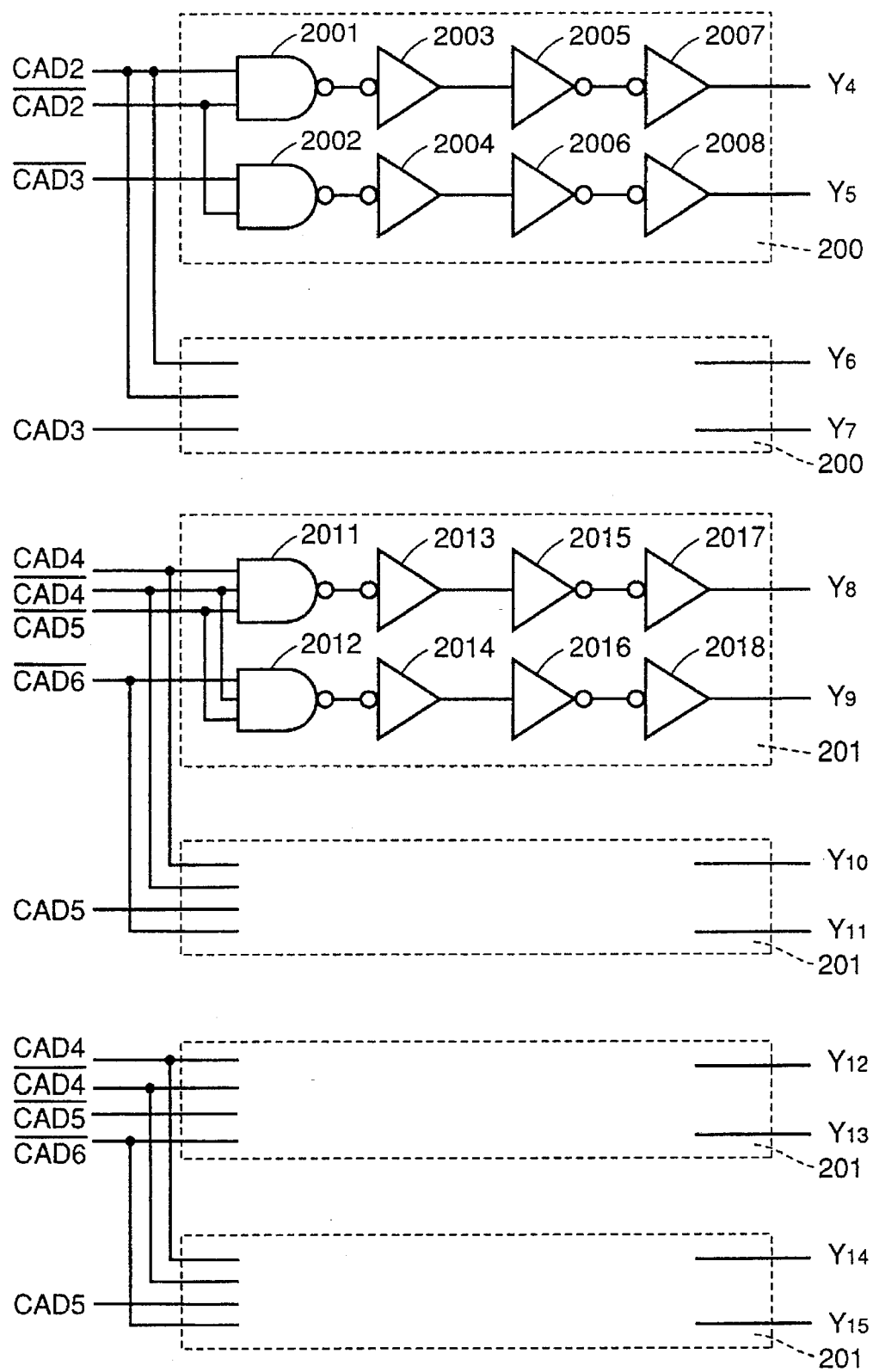
FIG. 21 is a circuit diagram showing an arrangement of a Y lower pre-decoder in FIG. 13.

(5) Column System Circuit (5.1) Y Lower Pre-decoder (FIG. 21)

FIG. 21 is a circuit diagram showing an arrangement of a Y lower pre-decoder 141 in FIG. 13. Referring to FIG. 21, this Y lower pre-decoder 141 includes 6 pre-decode portions 200 and 201. Each pre-decode portion 200 includes NAND gates 2001 and 2002, and inverters 2003–2008. Each pre-decode portion 201 includes NAND gates 2011 and 2012, and inverters 2013–2018. Therefore, this Y lower pre-decoder 141 generates pre-decode signals Y4–Y15 in response to complementary column address signals CAD2, $\overline{CAD2}$-CAD6, $\overline{CAD6}$.

Figure 22:
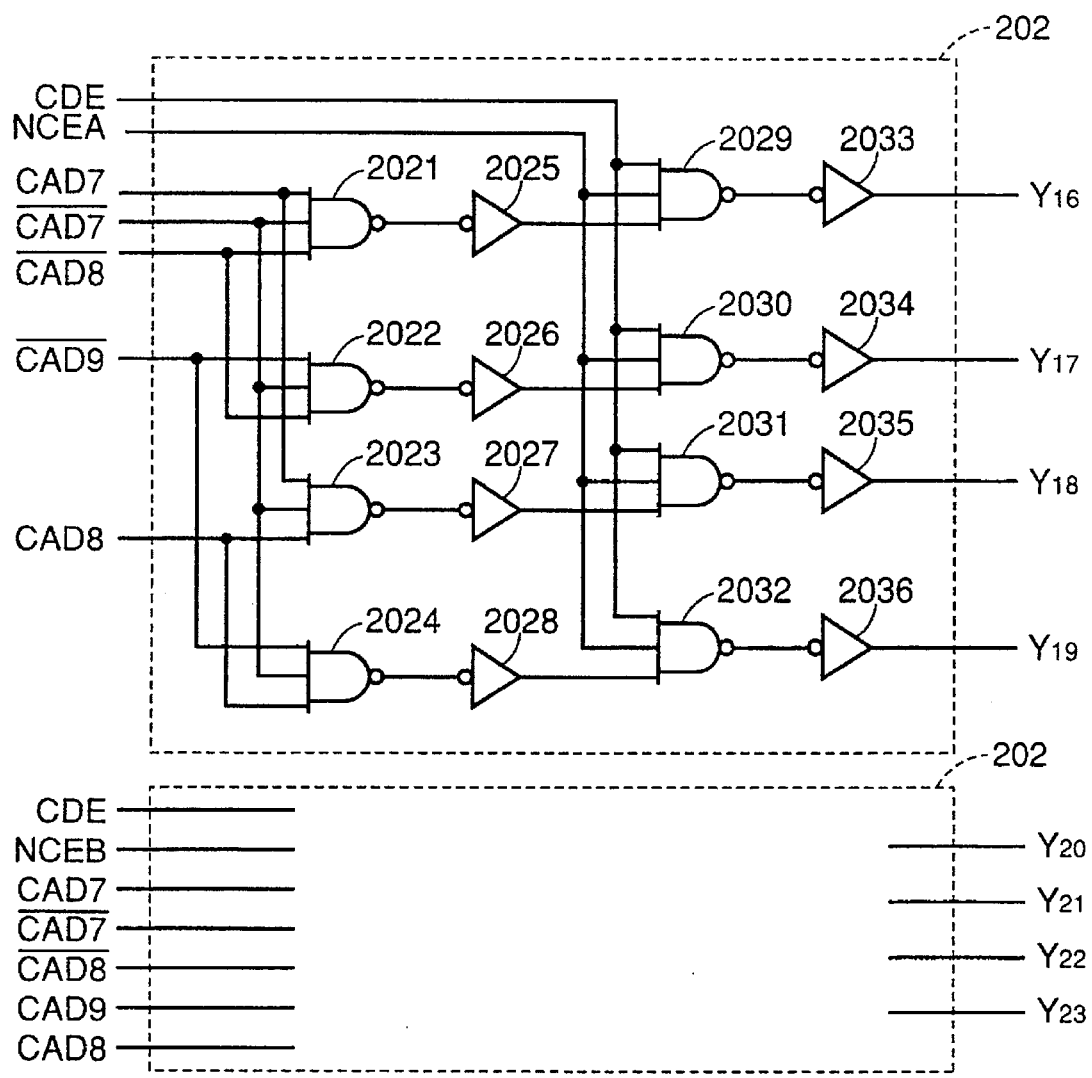
FIG. 22 is a circuit diagram showing an arrangement of a Y upper pre-decoder in FIG. 13.

(5.2) Y Upper Pre-decoder (FIG. 22)

FIG. 22 is a circuit diagram showing an arrangement of a Y upper pre-decoder 140 in FIG. 13. Referring to FIG. 22, this Y upper pre-decoder 140 includes two pre-decode portions 202. Each pre-decode portion 202 includes NAND gates 2021–2024 and 2029–2032, inverters 2025–2028 and 2033–2036. Both pre-decode portions 202 are activated in response to a column decode activation signal CDE generated when a row address strobe signal $\overline{RAS}$ is delayed. In addition, one of pre-decode portions 202 is activated in response to a normal column activation signal NCEA generated when a redundant row address has not been sensed, while the other pre-decode portion 202 is activated in response to a normal column activation signal NCEB. Therefore, if a column decode activation signal CDE and normal column activation signals NCEA and NCEB are at H levels, this Y upper pre-decoder 140 generates pre-decode signals Y16–Y23 in response to applied complementary column address signals CAD7, $\overline{CAD7}$–CAD9, $\overline{CAD9}$. If a redundant column address sensing circuit which will be described below senses a substitute address programmed in a redundant column address program circuit which will be described below, a normal column activation signal NCEA or NCEB falls to an L level, so that pre-decode signals Y16–Y19 or Y20–Y23 fall to L levels.

Figure 23:
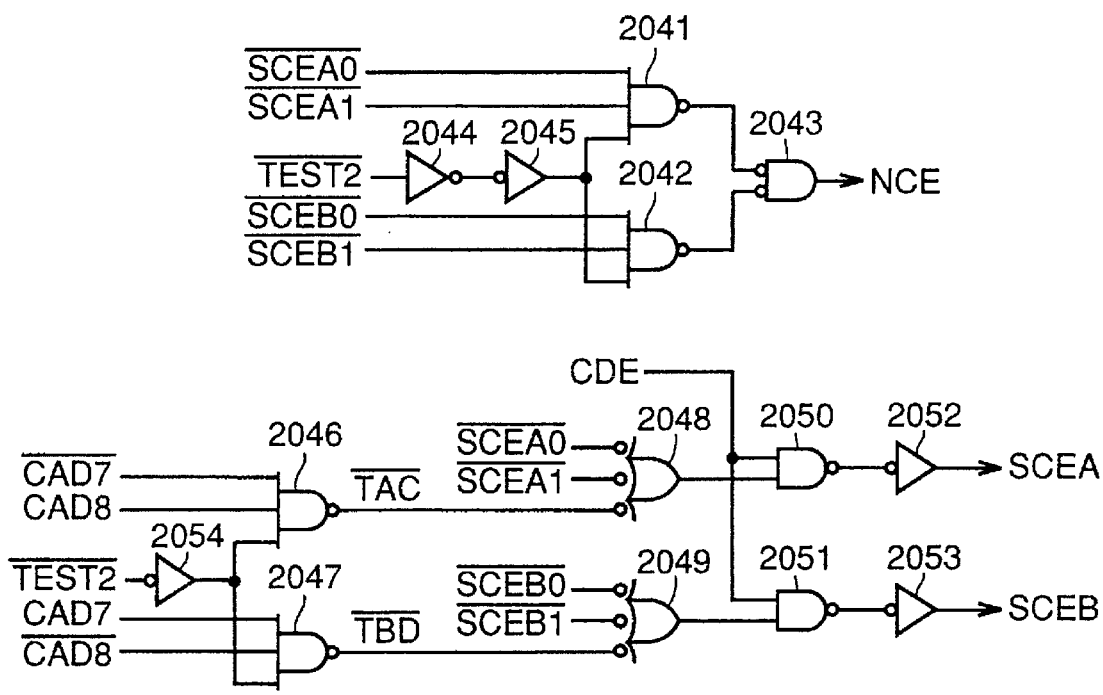
FIG. 23 is a circuit diagram showing an arrangement of a redundant column address sensing circuit included in the redundant memory control circuit in FIG. 1.
Figure 24:
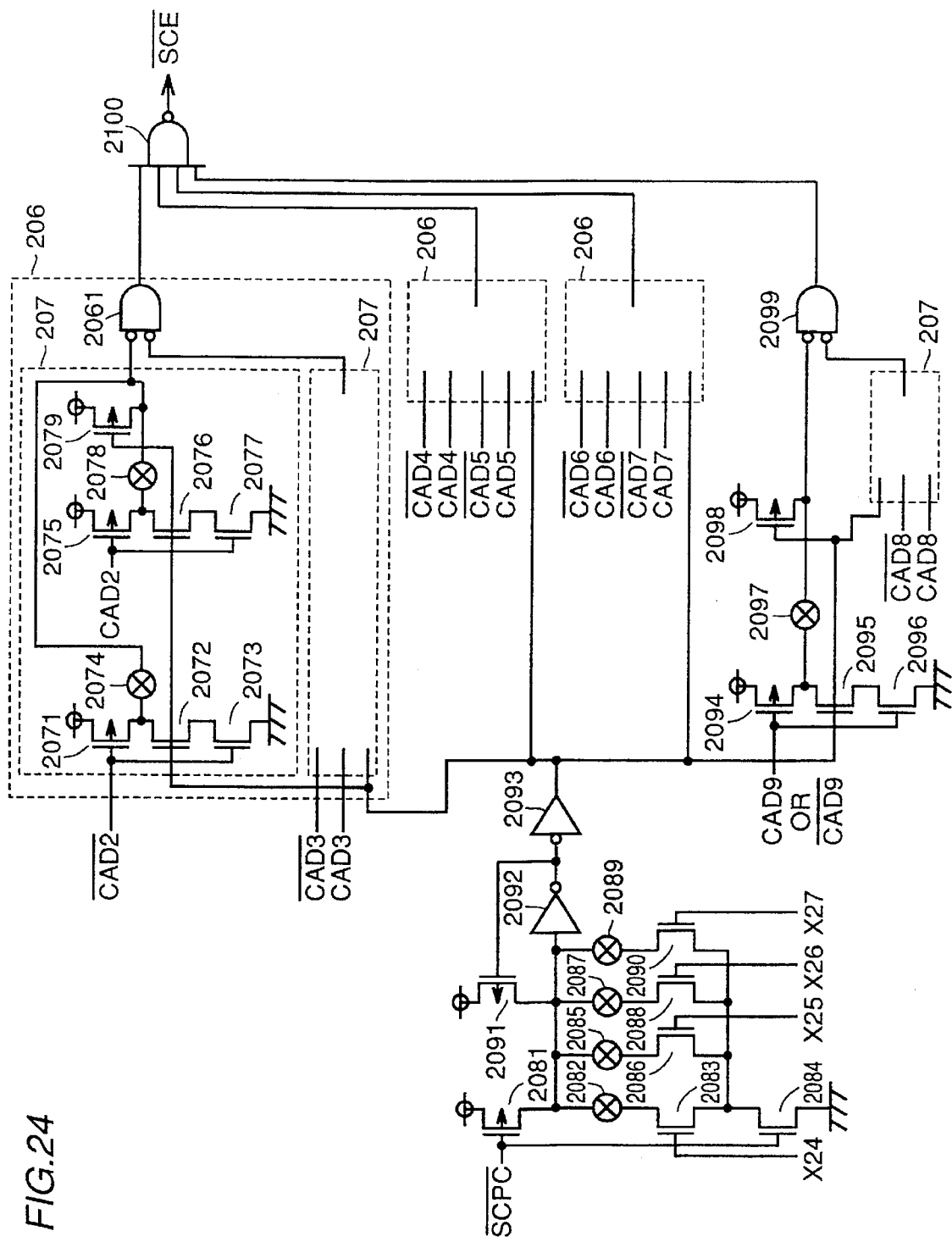
FIG. 24 is a circuit diagram showing an arrangement of a redundant column address program circuit included in the redundant memory control circuit in FIG. 1.

(5.3) Redundant Column Address Sensing Circuit and Redundant Column Address Program Circuit (FIG. 23, FIG. 24)

FIG. 23 is a circuit diagram showing an arrangement of a redundant column address sensing circuit included in redundant memory control circuit 113 of FIG. 1. Referring to FIG. 23, this redundant column address sensing circuit includes NAND gates 2041, 2042 and 2046–2051, inverters 2044, 2045 and 2052–2054, and an NOR gate 2043. In this redundant column address sensing circuit, a normal column activation signal NCE is generated in response to a redundant column test activation signal $\overline{TEST2}$ and defective column address sense signals $\overline{SCEA0}$, $\overline{SCEA1}$, $\overline{SCEB0}$ and $\overline{SCEB1}$ which are applied from a redundant column address program circuit which will be described below. In addition, redundant column activation signals SCEA and SCEB are generated in response to defective column address sense signals $\overline{SCEA0}$, $\overline{SCEA1}$, $\overline{SCEB0}$ and $\overline{SCEB1}$, complementary column address signals CAD7, $\overline{CAD7}$ and CAD8, $\overline{CAD8}$, and a redundant column test activation signal $\overline{TEST2}$.

FIG. 24 is a circuit diagram showing an arrangement of a redundant column address program circuit included in redundant memory control circuit 113 of FIG. 1. Referring to FIG. 24, the redundant column address programs circuit includes three sensing portions 206. Each sensing portion 206 includes two program portions 207 and an NOR gate 2061. Each program portion includes P channel MOS transistors 2071, 2075 and 2079, N channel MOS transistors 2072, 2073, 2076 and 2077, and fuse elements 2074 and 2078. This redundant column address program circuit further includes P channel MOS transistors 2081, 2091, 2094 and 2098, fuse elements 2082, 2085, 2087, 2089 and 2097, N channel MOS transistors 2083, 2084, 2086, 2088, 2090, 2095 and 2096, inverters 2092 and 2093, a program portion 207, an NOR gate 2099, and an NAND gate 2100. A redundant column precharge signal $\overline{SCPC}$ is applied to gate electrodes of P channel MOS transistor 2081 and N channel MOS transistor 2084. An address which is programmed is constituted by pre-decode signals X24–X26 which are generated in response to complementary column address signals CAD2, $\overline{CAD2}$–CAD9, $\overline{CAD9}$ and complementary row address signals RAD8, $\overline{RAD8}$ and RAD9, $\overline{RAD9}$. This corresponds to use of a redundant column memory cell which is connected one redundant column selection line in response to pre-decode signals X24–X26 and is divided into four portions. Since defects are hardly produced on the same Y line beyond a memory cell array block sandwiched between sense refresh amplifier bands, it is more advantageous for improvement in yield due to larger degree of freedom in a random Y line. In addition, if fuse elements 2082, 2085, 2087 and 2097 respectively corresponding to pre-decode signals X24–X27 are blown simultaneously, defects in a column decoder can be dealt with as well. In the case of the semiconductor memory device which is not in the redundant column test mode, if a substitute address has not been programmed or an address different from a substitute address is applied, all the defective column address sense signals $\overline{SCE}$ attain H levels, and an output signal $\overline{TAC}$ of NAND gate 2046 and an output signal $\overline{TBD}$ of NAND gate 2047 attain H levels. Accordingly, both redundant column activation signals SCEA and SCEB fall to L levels. At this time, a normal column activation signal NCE is being activated at an H level.

In the case of the semiconductor memory device which is not in the redundant column test mode (a redundant column test activation signal $\overline{TEST2}$ is at an H level), if an applied address signal matches a programmed address, a defective column address sense signal $\overline{SCE}$ falls to an L level. Thus, one of redundant column activation signals SCEA and SCEB is activated to an H level.

Description of the case where the semiconductor memory device is in the redundant column test mode (a redundant column test activation signal $\overline{TEST2}$ is at an L level) will now be given. In this case, if both column address signals $\overline{CAD7}$ and CAD8 are at H levels, an output signal $\overline{TAC}$ of NAND gate 2046 falls to an L level, so that a redundant column activation signal SCEA is activated to an H level. On the other hand, if both column address signals CAD7 and $\overline{CAD8}$ are at H levels, an output signal $\overline{TBD}$ of NAND gate 2047 falls to an L level, so that a redundant column activation signal SCEB is activated to an H level. At the same time, a normal column activation signal NCE falls to an L level, so that a normal column selection line CSLi is in a non-selection state.

The reason why complementary row addresses CAD7, $\overline{CAD7}$ and CAD8, $\overline{CAD8}$ are used is the same as that in the case of the redundant row test mode described above. An address to be programmed will be unnecessary if redundant column activation signals SCEA and SCEB are forcibly activated. Accordingly, provision of a decoding circuit for selecting redundant column activation signals SCEA and SCEB by an address which will be unnecessary allows a functional test of all the redundant memory cells except a redundant column memory cell located at an intersection of a redundant row and a redundant column to be carried out only by combination of externally applied address signals. In addition, memory cell array blocks respectively selected by redundant column activation signals SCEA, SCEB, SCEC and SCED belong to memory planes which are different from each other, and therefore, selected memory cell array blocks will not conflict with each other even if redundant column activation signals SCEA and SCEC are forcibly activated simultaneously. In this case, memory planes are switched by a column address signal CAD9 or $\overline{CAD9}$ applied to gate electrodes of P channel MOS transistor 2094 and N channel MOS transistor 2096 shown in FIG. 24. In addition, as in the case of redundant column activation signals SCEA and SCEC, no trouble will not be caused even if redundant column activation signals SCEB and SCED are forcibly activated simultaneously.

As described above, if a redundant row test activation signal $\overline{TEST2}$ falls to an L level, a normal column activation signal NCE is forcibly rendered at an L level regardless of defective column address sense signals $\overline{SCEA0}$, $\overline{SCEA1}$ and $\overline{SCEB0}$, $\overline{SCEB1}$. In addition, if a redundant column test activation signal $\overline{TEST2}$ falls to an L level, redundant column activation signals SCEA and SCEB are selectively activated according to complementary column address signals CAD7, $\overline{CAD7}$ and CAD8, $\overline{CAD8}$, regardless of defective column address sense signals $\overline{SCEA0}$, $\overline{SCEA1}$, $\overline{SCEB0}$ and $\overline{SCEB1}$.

Although an example in which there are four redundant column activation signals SCEA–CED has been described, 7 addresses CAD2, $\overline{CAD2}$–CAD8, $\overline{CAD8}$ for program are used herein, and therefore, $2^7$ redundant column activation signals can be selected according to externally applied address signals. However, an arrangement in which the number of column address signals used is the same as that of redundant column activation signals applied to a redundant column decoder SCDC is optimal. In addition, if redundant column activation signals exist as combinations corresponding to different planes of columns as described above, an arrangement in which 1/N redundant column activation signals are used is possible with the number of planes indicated by N. Thus, if the number of redundant column activation signals is made optimum, additional control signals will not be required, so that increase in area of a column decoder can be suppressed.

Figure 25:
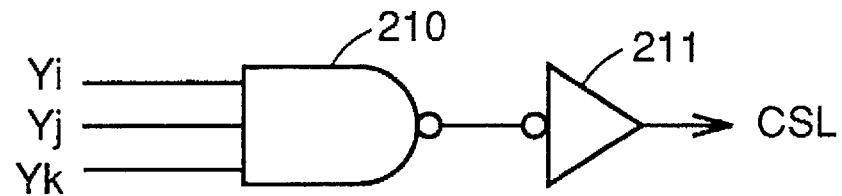
FIG. 25 is a circuit diagram partially showing a column decoder in FIG. 1.
Figure 26:
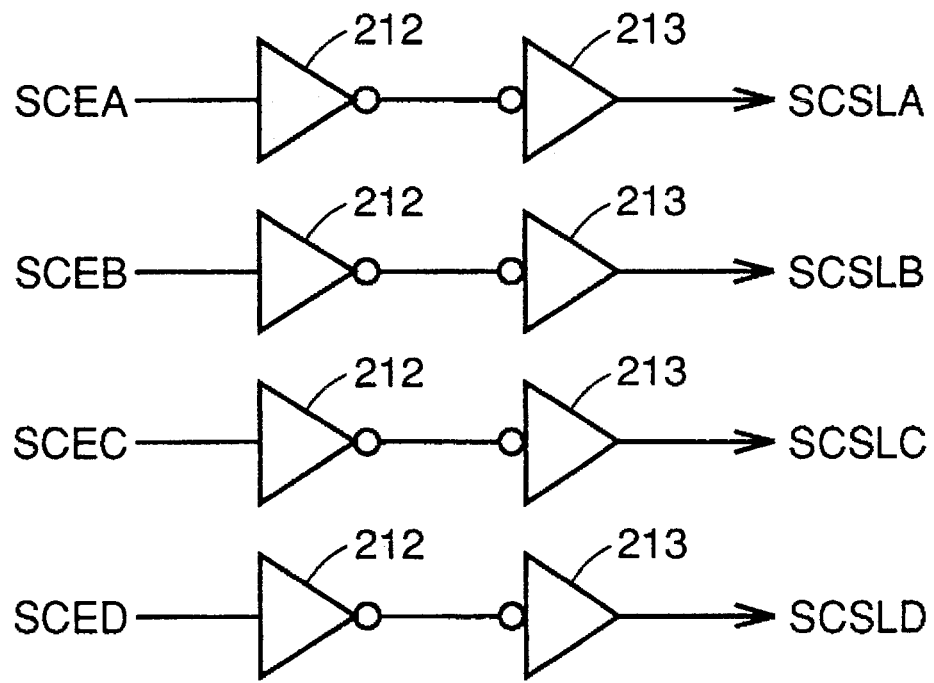
FIG. 26 is a circuit diagram showing an arrangement of a redundant column decoder in FIG. 1.

(5.4) Column Decoder and Redundant Column Decoder (FIG. 25, FIG. 26)

FIG. 25 is a circuit diagram showing an arrangement of one column decoder. This column decoder includes an NAND gate 210 and an inverter 211. Accordingly, a corresponding column selection line CSL is activated in response to three Y pre-decode signals Yh, Yj and Yk.

FIG. 26 is a circuit diagram showing an arrangement of the redundant column decoder SCDC in FIG. 3. Referring to FIG. 26, the redundant column decoder SCDC includes 8 inverters 212 and 213. Accordingly, if one of redundant column activation signals SCEA–SCED is activated, a redundant column selection line corresponding to the activated redundant column activation signal out of redundant column selection lines SCSLA–SCSLD is activated. Since a normal memory cell MC shown in FIGS. 13 and 14 is substituted for a redundant row memory cell RMC in the same memory cell array block, data from any memory cells are input/output through the same local I/O line pair. Similarly, since a normal memory cell MC is also substituted for a redundant column memory cell CMC in the same memory cell array block, data from any memory cells are input/output through the same local I/O line pair. Accordingly, regardless of a subsequent hierarchical structure of data, that is, even if the local I/O line pairs are connected to a global I/O line, structure of any of a normal memory cell, a redundant memory cell, a read system and a write system will not need to be modified at all. Therefore, since data can be shrunk easily in the case of performing a multi-bit test of the JEDC standard, the multi-bit test can be applied to any of three kinds of redundant memory cell tests (a redundant row memory cell test, a redundant column memory cell test, and a redundant row column memory cell test).

(6) Method of Performing a Functional Test of a Redundant Memory Cell

A method of performing a functional test of a redundant memory cell in a die sort test will now be described with respect to an example of 16M DRAM having×8 bit structure and 2K refresh cycle. In this case, a redundant row is controlled by 2 system redundant row address sense signals SRA and SRB, and a redundant column is controlled by 4 system redundant column activation signals SCEA–SCED. Redundant column activation signals SCEA and SCEB and redundant column activation signals SCEC and SCED correspond to column address spaces which are different from each other. More specifically, even if redundant column activation signals SCEA and SCEC are forcibly activated simultaneously, these signals respectively control column address spaces which are different from each other, and therefore, no problem will be produced. Similarly, even if redundant column activation signals SCEB and SCED are forcibly activated simultaneously, these signals respectively control column address spaces which are different from each other, and therefore, no problem will be produced. Accordingly, combination of redundant column activation signals SCEA and SCEC and combination of redundant column activation signals SCEB and SCED so as to classify redundant columns into two systems may be carried out.

(6.1) First, a method of testing a redundant memory cell will now be described (6.1.1) Signals at a super H level, an H level, an H level, an L level and an L level are input to address pins A1–A5 at a WCBR timing, respectively, and a semiconductor memory device is set to be in a redundant row memory test mode.

(6.1.2) Then, a redundant memory cell controlled by a redundant row address sense signal SRA is tested. In this case, since addresses other than addresses used for program are used, row address signals RA0, RA8, RA9, RA10 and RA11 are at L levels, and a row address signal RA6 is at an H level. Furthermore, all the column addresses CA0–CA9 are used herein. A functional test is performed using signals at a normal H level and an L level in such a limited address space. At this time, if there is a defective redundant row memory cell, a row address thereof is stored. For example, this address is indicated by XA1.

(6.1.3) Then, a redundant memory cell controlled by a redundant row address sense signal SRB is tested. After the functional test for the whole address space described above in (6.1.2) is completed, a functional test is performed with a row address signal RA7 being at an H level and a row address signal RA6 at an L level, using other row addresses RA0, RA8, RA9 and RA10 and all the column addresses CA0–CA9. At this time, if there is a defective redundant row memory cell, a row address thereof is stored. For example, this address is indicated by XB1.

(6.1.4) A redundant row test mode is reset. An ROR timing or a CBR timing is input.

(6.2) Then, a method of testing a redundant column memory cell will now be described.

(6.2.1) First, a semiconductor memory device is set to be in a redundant column test mode. Signals at a super H level, a normal H level and an L level are input to address pins A1–A5 at a WCBR timing, respectively. A semiconductor memory device is set to be in a redundant column memory test mode by this address key.

(6.2.2) Then, a redundant column memory cell controlled by redundant column activation signals SCEA and SCED is tested. Since addresses other than addresses used for program are used, a column address CA8 is rendered at an H level and a column address CA7 is rendered at an L level, and column addresses CA0, CA1, and CA9 as well as all the row addresses RA0–RA10 are used. A functional test is carried out using signals at a normal H level and an L level in such a limited address space. At this time, if there is a defective redundant column memory cell, a column address thereof is stored. For example, this address is indicated by (X25, XAC1).

(6.2.3) Then, a redundant column memory cell controlled by redundant column activation signals SCEB and SCED is tested. After the functional test for the whole address space described above in (6.2.2) is completed, a functional test is carried out with a column address CA8 rendered at an L level and a column address CA7 at an H level, using column addresses CA0, CA1 and CA9 and all the row addresses RA0–RA10. At this time, if there is a defective column memory cell, a column address thereof is stored. For example, this address is indicated by (X26, XBD1).

(6.2.4) Finally, a redundant column test mode is reset by input of an ROR timing or a CBR timing.

(6.3) Then, a method of testing a memory cell located at an intersection of a redundant row and a redundant column will now be described.

(6.3.1) First, a redundant row test mode and a redundant column test mode are set simultaneously. Signals at a super H level, a normal H level, a normal H level, a normal H level and an L level are input to address pins A1–A5 at a WCBR timing, respectively. The redundant row test mode and the redundant column test mode can be set simultaneously by this address key.

(6.3.2) A memory cell located at an intersection of a redundant row and a redundant column controlled by redundant column activation signals SCEA and SCEC out of memory cells controlled by a redundant row address sense signal SRA is tested. In this case, the address space described above in (6.1.2) and (6.2.3) is an address space used by selection addresses (RA8, RA7, CA8 and CA7). A row address RA7 is rendered at an L level, a row address RA6 is rendered at an H level, and row addresses RA0, RA8, RA9 and RA10 are used. In addition, a column address CA8 is rendered at an H level, a column address CA7 is rendered at an L level, and column addresses CA0, CA1 and CA9 are used. A functional test is performed using signals at a normal H level and an L level in such a limited address space. At this time, if there is a defective address, a row address and a column address of this defective address are stored. For example, this defective address is indicated by (X*A1, Y*AC1).

(6.3.3) Then, a memory cell located at an intersection of a redundant row and a redundant column controlled by redundant column activation signals SCEB and SCED out of memory cells controlled by a redundant row address sense signal is tested. After the functional test for the whole address space described above in (6.3.2) is completed, a row address RA7 is rendered at an L level, a row address RA6 is rendered at an H level, and row addresses RA0, RA8, RA9 and RA10 are used, as well as a column address CA8 is rendered at an L level and a column address CA7 is rendered at an H level, whereby a functional test for the whole space of column addresses CA0, CA1 and CA9 is performed. At this time, if there is a defective memory cell located at an intersection, a row address and a column address thereof are stored. For example, this address is indicated by (X*A2, Y*BD1).

(6.3.4) Then, a memory cell located at an intersection of a redundant row and a redundant column controlled by redundant column activation signals SCEA and SCEC out of memory cells controlled by a redundant row address sense signal SRB is tested. After the functional test for the whole space described above in (6.3.3) is completed, a row address RA7 is rendered at an H level, a row address RA6 is rendered at an L level, and row addresses RA0, RA8, RA9 and RA10 are used, as well as a column address CA8 is rendered at an H level, a column address CA7 is rendered at an L level, and a functional test for the whole space of column addresses CA0, CA1 and CA9 is performed. At this time, if there is a defective memory cell located at an intersection, a row address and a column address thereof are stored. For example, this address is indicated by (X*B1, Y*AC2).

(6.3.5) Then, a memory cell located at an intersection of a redundant row and a redundant column controlled by redundant column activation signals SCEB and SCED out of memory cells controlled by a redundant row address sense signal SRB is tested. After the functional test for the whole space described above in (6.3.4) is completed, a row address RA7 is rendered at an H level, a row address RA6 is rendered at an L level, and row addresses RA0, RA8, RA9 and RA10 are used, as well as a column address CA8 is rendered at an L level, a column address CA7 is rendered at an H level, and column addresses CA0, CA1 and CA9 are used, whereby a functional test for the whole address space is performed. At this time, if there is a defective memory cell located at an intersection, a row address and a column address thereof are stored. For example, this address is indicated by (X*B2, Y*BD2).

(6.3.6) Finally, a redundant row test mode and a redundant column test mode are reset by input of an ROR timing or a CBR timing.

(6.3.7) Then, usable redundant rows and usable redundant columns are determined according to defective address information obtained.

(6.3.8) Then, a functional test for the whole address space of normal memory cells is performed. At this time, if there is a defective memory cell, an address thereof is defined by X line defect and Y line defect, and information of the address is stored. For example, addresses of X line defects are represented by $\overline{X1}$, $\overline{X2}$, (X25, $\overline{Y1}$) and (X26, $\overline{Y2}$).

(6.3.9) Then, the result of the above mentioned (6.3.8) is analyzed within the range of usable redundant rows and usable redundant columns. A repair code is then output if repair is possible.

(6.3.10) Then, programming is performed by means of laser trimmer according to the output repair code., (6.3.11) Finally, a functional test is performed for all the chips to determine whether each chip is acceptable or not.

(6.3.12) The procedure described above is shown by way of example, and a functional test can be also carried out in a multi-bit test mode. The use of this multi-bit test mode is highly effective, since time required for test is reduced. In addition, the order of test modes may be any order.

(7) Effects of the First Embodiment (7.1) A special test mode is set by latch of address keys. Each special test mode activation signal is held by means of a latch circuit. Therefore, if a latch circuit is located at the final stage of an output logic gate, a logic gate having larger size is required (rising speed and falling speed are also considered). However, since a latch circuit is used at the position closest to the first stage, a logic gate can have a small size, resulting in reduction in area.

(7.2) Furthermore, since it is a test mode activation signal FE output by rise of a row address strobe signal $\overline{RAS}$ that finally outputs an activation signal, and a special test mode main clock signal to be activated before the output of the activation signal is ready to be output, and therefore, possibility of wrong setting is reduced.

(7.3) Since a multi-bit test of JEDEC standard can be set by input of address keys as well as input of a WCBR, a special test mode complexed with a multi-bit test can be readily implemented.

(7.4) Since a test group signal in a special test mode is activated by two H levels, that is, a normal H level and a super H level, possibility of wrong setting caused by difference in level between an output buffer signal of a device and other drivers such as an address generating circuit is reduced when the device has been packaged.

(7.5) Since a redundant row test mode and a redundant column test mode are provided and these two modes can be set simultaneously, a functional test of a memory cell located at an intersection of a redundant row and a redundant column can be implemented. Therefore, since a functional test can be performed for all the redundant memory cells, functions of all the memory cells can be checked before repair processing (before blowing fuse elements) at the time of a die sort test. Accordingly, yield can be surely improved.

(7.6) Redundant row memory cells and redundant column memory cells exist in a memory cell array block sandwiched between sense refresh amplifier bands, a redundant row decoder, a redundant column decoder, redundant sense refresh amplifier bands are provided, normal memory cells and redundant row memory cells exist on the same bit line, normal memory cells and redundant column memory cells exist on the same word line, and data of memory cells are input/output through the same local I/O line pair, and therefore, a functional test of redundant memory cells can be performed easily by a multi-bit test.

(7.7) A redundant row is selected by means of a redundant word line driving signal, redundant rows are classified into two systems, and selection of these two systems is performed by means of combination of program address signals which need not to be used, and therefore, use of multiple signals for switching is not necessary. In addition, increase in wiring is not necessary, either.

(7.8) A redundant column is selected by means of a redundant column activation signal, signals of four systems are not in charge of the same memory cell array block, that is, signals which do not conflict with each other are selected simultaneously, and redundant columns are classified into two systems. In addition, since selection of these two systems is carried out by means of combination of program address signals which need not to be used, use of multiple signals for switching is not necessary. Furthermore, increase in wiring is not necessary, either.

(7.9) Since determination, reset, selection and switching of test modes are carried out by means of external signals $\overline{RAS}$, $\overline{CAS}$ and $\overline{WE}$ and states of address pins, a functional test can be performed even for a molded product. In this case, effects of molded in a later process on chips can be inspected by particularly examining access to redundant memory cells or by examining redundant memory cells located on the end of a memory cell array. Accordingly, manufacture margin can be improved.

(7.10) Since clock pins and address pins connected to external pins are used and other pads are not used, increase in chip area can be suppressed for products such as multi-bit products in which additional pads directly lead to increase in chip.

Second Embodiment

Figure 27:
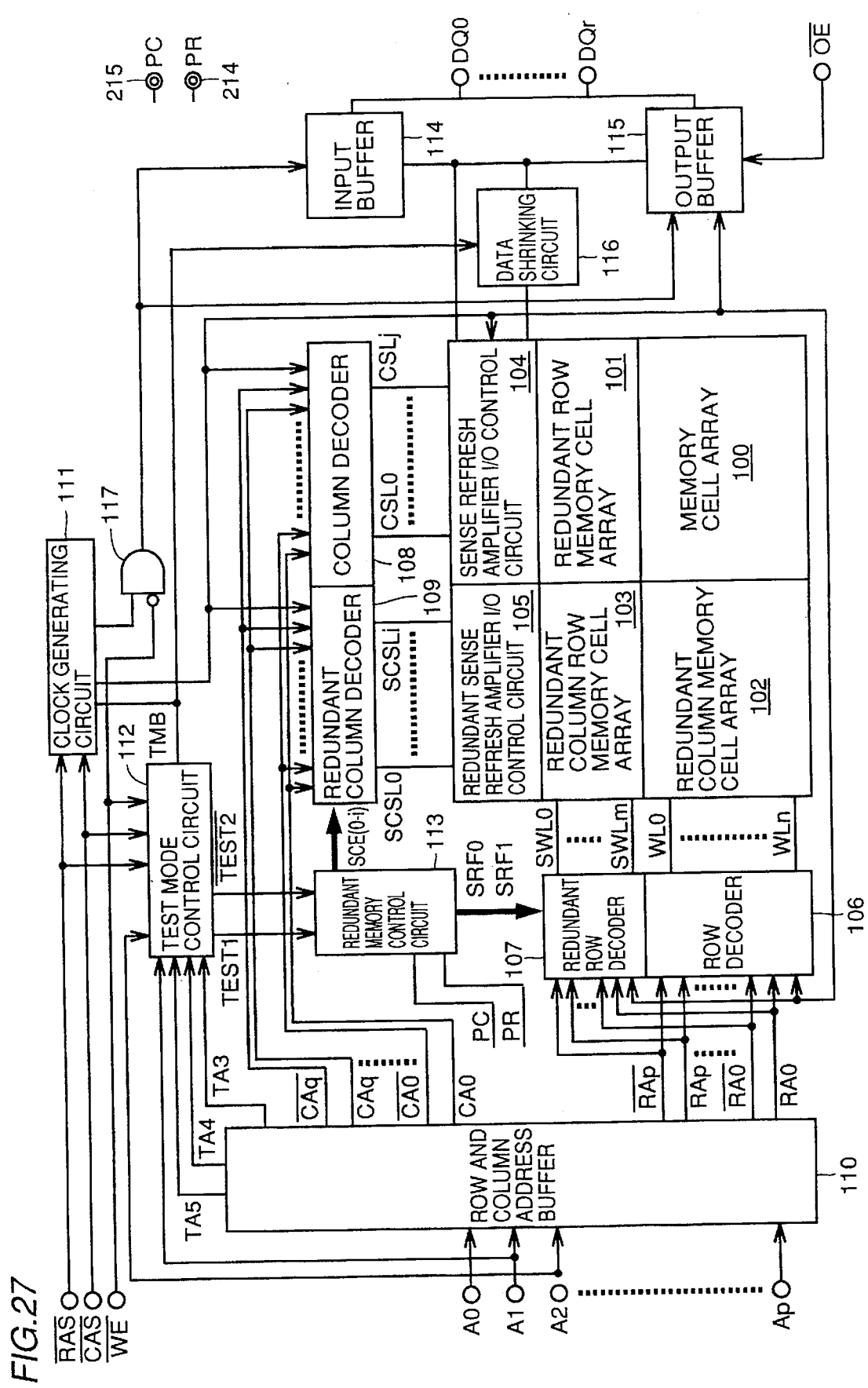
FIG. 27 is a block diagram showing the whole arrangement of a semiconductor memory device in accordance with a second embodiment of the present invention.

FIG. 27 is a block diagram showing the whole arrangement of a semiconductor memory device in accordance with a second embodiment of the present invention. As opposed to the first embodiment of FIG. 1, voltage PR for switching is applied to an external pad 214 instead of address signals RAs1 and RAs2 for selecting redundant word line driving signals SRF0 and SRF1 in the second embodiment. Therefore, 2-system redundant rows are switched according to the voltage PR of external pad 214. In addition, voltage PC for switching is applied to an external pad 215 instead of address signals CAs1 and CAs2 for selecting redundant column activation signals SCE0–SCEi. Therefore, 2-system redundant columns are switched according to the voltage PC of external pad 215.

Figure 28:
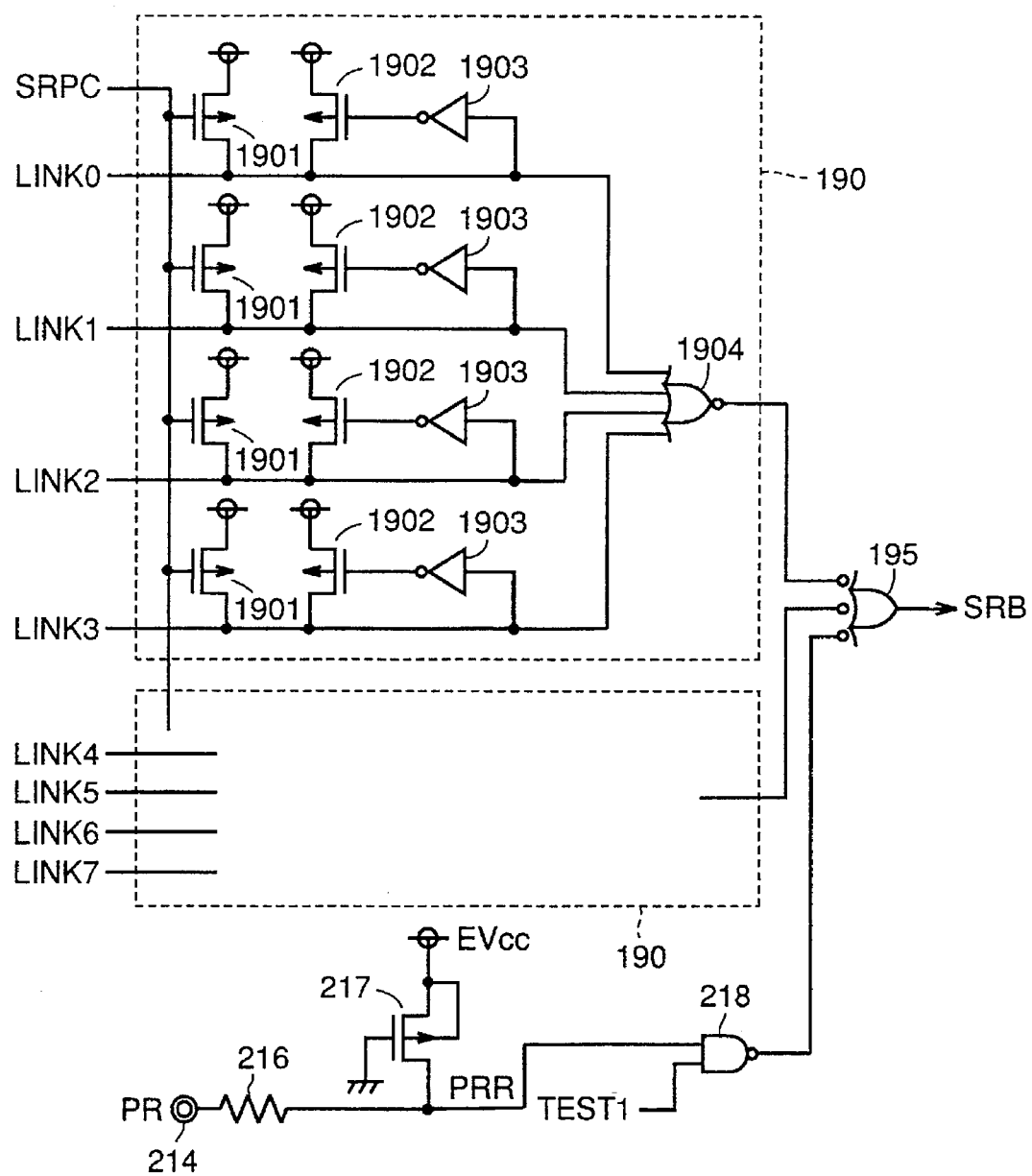
FIG. 28 is a circuit diagram showing an arrangement of a redundant row address sensing circuit included in a redundant memory control circuit in FIG. 27.

FIG. 28 is a circuit diagram showing an arrangement of a redundant row address sensing circuit used instead of the redundant row address sensing circuit of the first embodiment shown in FIG. 19. As opposed to the first embodiment of FIG. 19, the second embodiment includes external pad 214, a resistance 216 connected between external pad 214 and a node PRR, a P channel MOS transistor 217 connected between a node to which an external power supply voltage EVcc is applied and node PRR, and an NAND gate 218 for receiving voltage at node PRR and a redundant row test activation signal TEST1. This P channel MOS transistor has small size, external power supply voltage EVcc is applied to a source electrode thereof, and ground voltage is applied to a gate electrode thereof. Accordingly, transistor 217 pulls up voltage at node PRR to an H level when pad 214 is in a floating state. An output signal of NAND gate 218 is applied to one input node of an NAND gate 195.

If the semiconductor memory device as described above has not entered into a redundant row test mode, a redundant row test activation signal TEST1 is at an L level, and therefore, an output signal of NAND gate 218 attains an H level. Accordingly, if an applied address matches a programmed substitute address, a redundant row address sense signal SRB is activated to an H level. On the other hand, if an applied address does not match a programmed substitute address or if a substitute address has not been programmed, a redundant row address sense signal SRB is deactivated to an L level.

Figure 29:
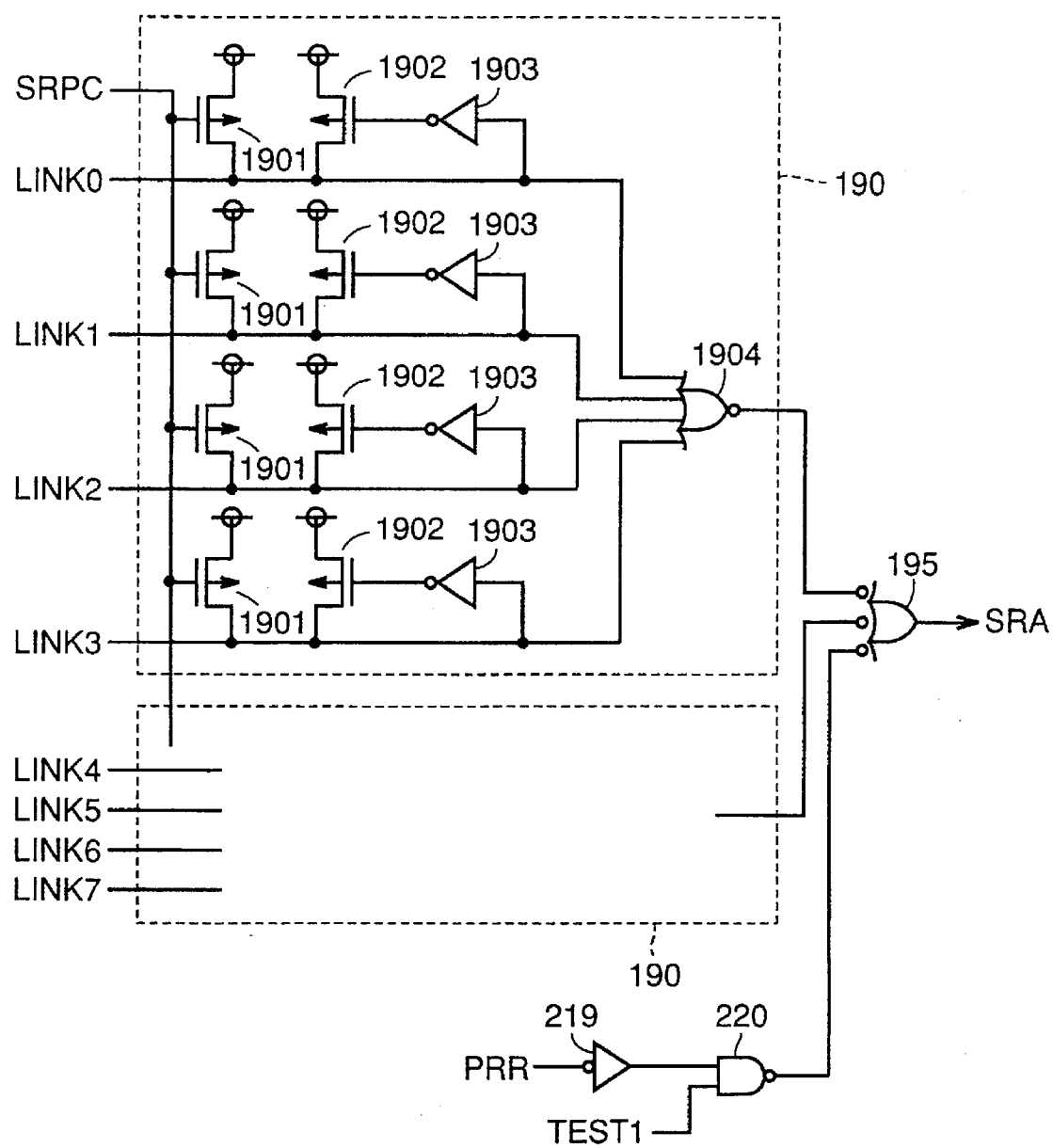
FIG. 29 is a circuit diagram showing an arrangement of another redundant row address sensing circuit included in the redundant memory control circuit in FIG. 27.

FIG. 29 is a circuit diagram showing the whole arrangement of a redundant row address sensing circuit used instead of the redundant row address sensing circuit of the first embodiment shown in FIG. 19. As opposed to the redundant row address sensing circuit shown in FIG. 19, the redundant row address sensing circuit of the second embodiment includes an inverter 219 and an NAND gate 220. Voltage at node PRR shown in FIG. 28 is applied to one input node of NAND gate 220 through inverter 219. A redundant row test activation signal TEST1 is applied to the other input node of NAND gate 220. An output signal of NAND gate 220 is applied to one input node of NAND gate 195. Accordingly, if the semiconductor memory device has not entered into a redundant row test mode, the redundant row address sensing circuit shown in FIG. 29 operates in a manner similar to that of the redundant row address sensing circuit shown in FIG. 28.

Then, if the semiconductor memory device enters into a redundant row test mode, a redundant test activation signal TEST1 attains an H level. If external pad 214 is in a floating state or if a signal at an H level is applied to external pad 214, a redundant row address sense signal SRB is activated to an H level, while a redundant row address sense signal SRA is kept deactivated at an L level. Then, if a signal at an L level is applied to external pad 214, a redundant row address sense signal SRA is activated to an H level, while a redundant row address sense signal SRB is deactivated to an L level. Therefore, 2-system redundant row address sense signals SRA and SRB can be switched forcibly even if such a circuit arrangement is used. Thus, 2-system redundant row address sense signals SRA and SRB are switched by external pad 214 and an address signal is input externally, whereby a functional test can be performed for all the redundant row memory cells except a redundant row memory cell located at an intersection of a redundant column, and a redundant row and a normal row.

Figure 30:
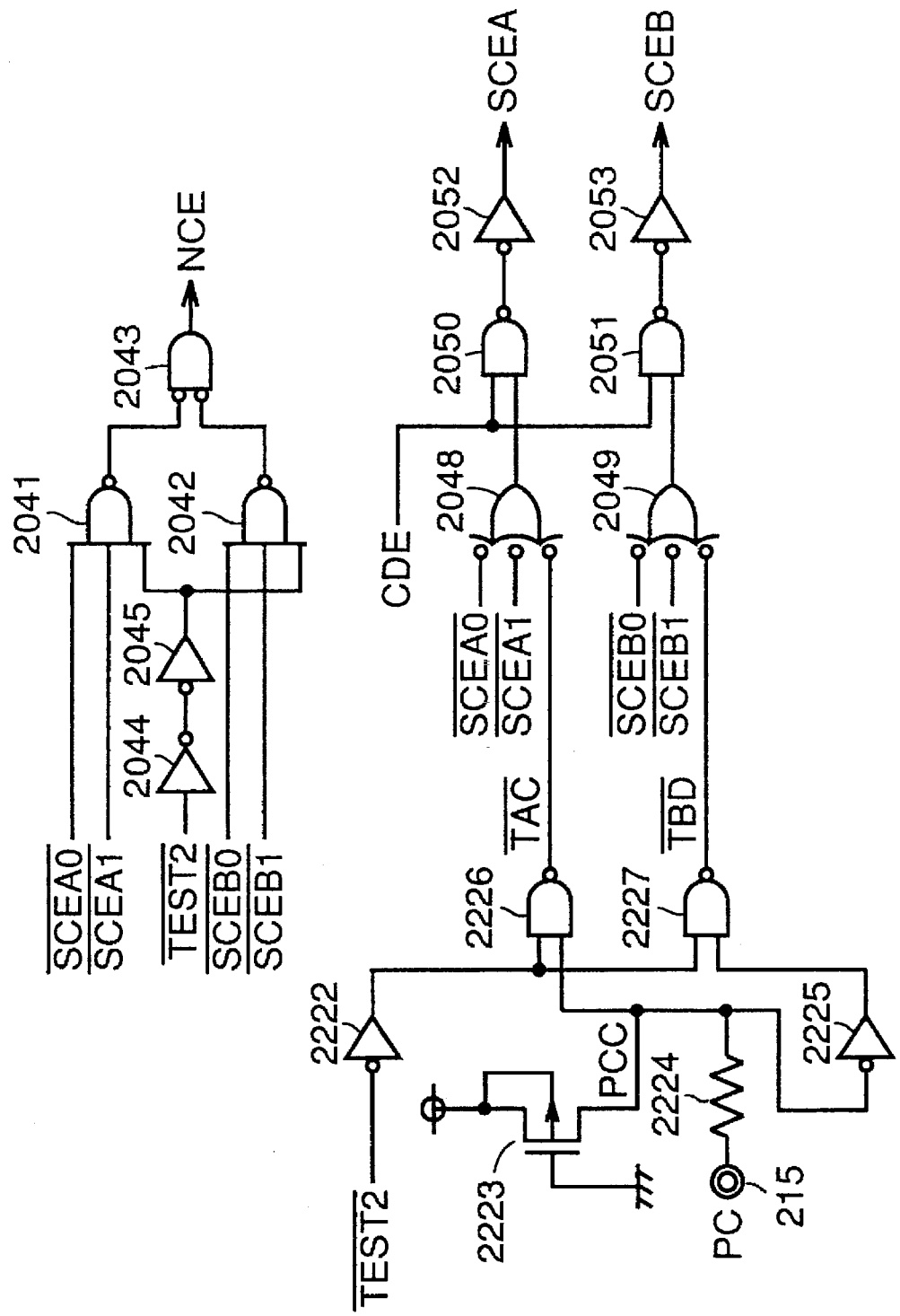
FIG. 30 is a circuit diagram showing an arrangement of a redundant column address sensing circuit included in the redundant memory control circuit in FIG. 27.
Figure 31:
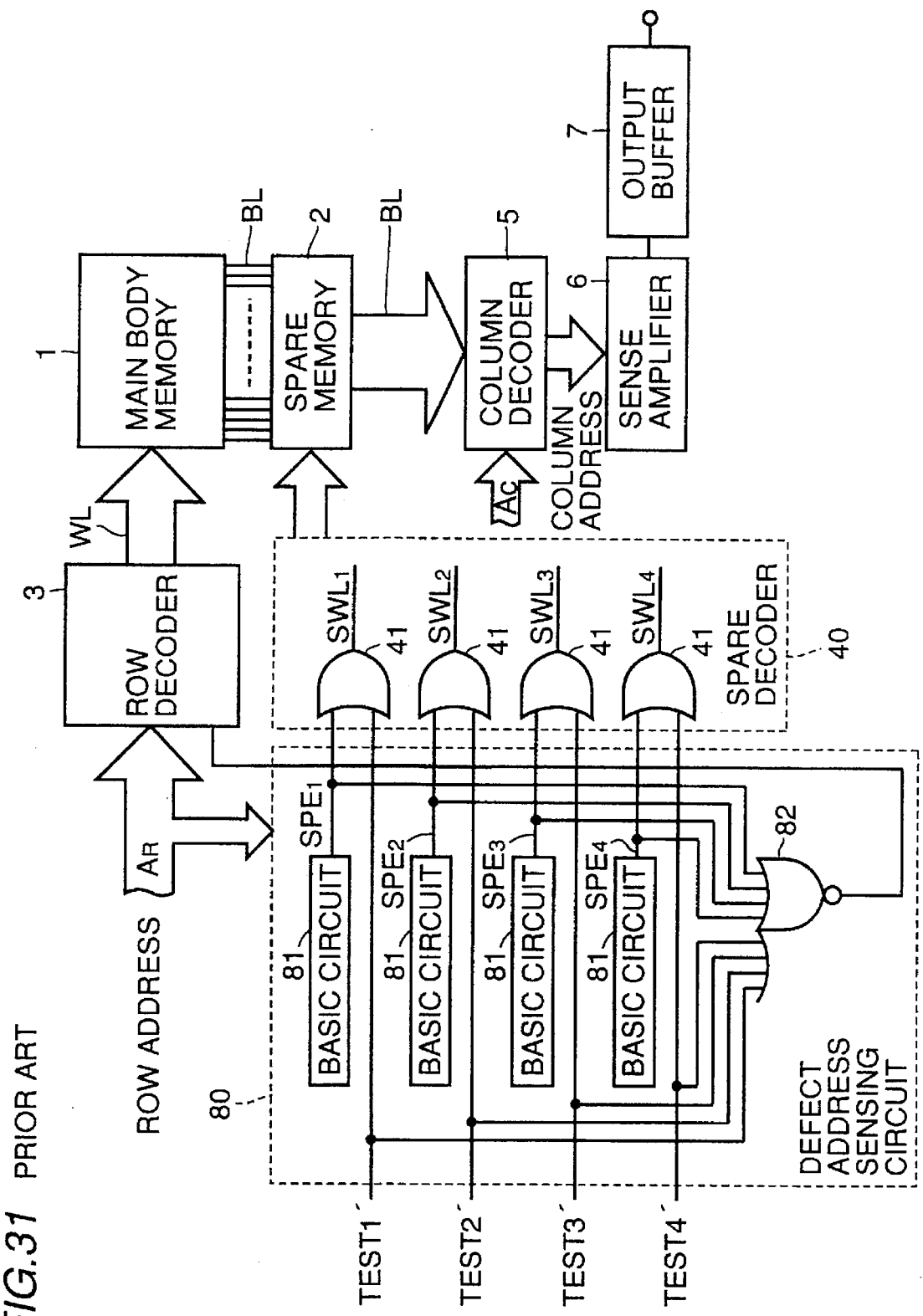
FIG. 31 is a block diagram showing an arrangement of a conventional semiconductor memory device which can be subjected to a test of determining whether a spare memory therein is acceptable or not before substitution.
Figure 32:
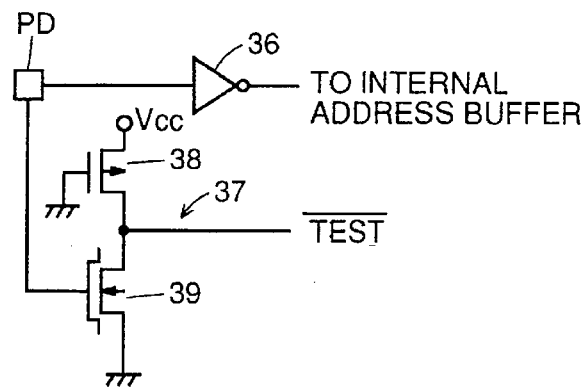
FIG. 32 is a circuit diagram showing an arrangement of a test mode sensing circuit used in the semiconductor memory device of FIG. 31.
Figure 33:
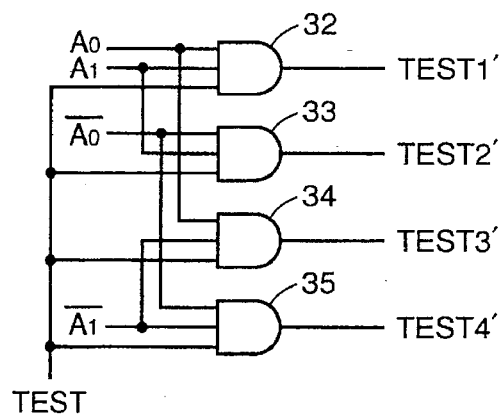
FIG. 33 is a circuit diagram showing an arrangement of a test signal decoder circuit used in the semiconductor memory device of FIG. 31.
Figure 34:
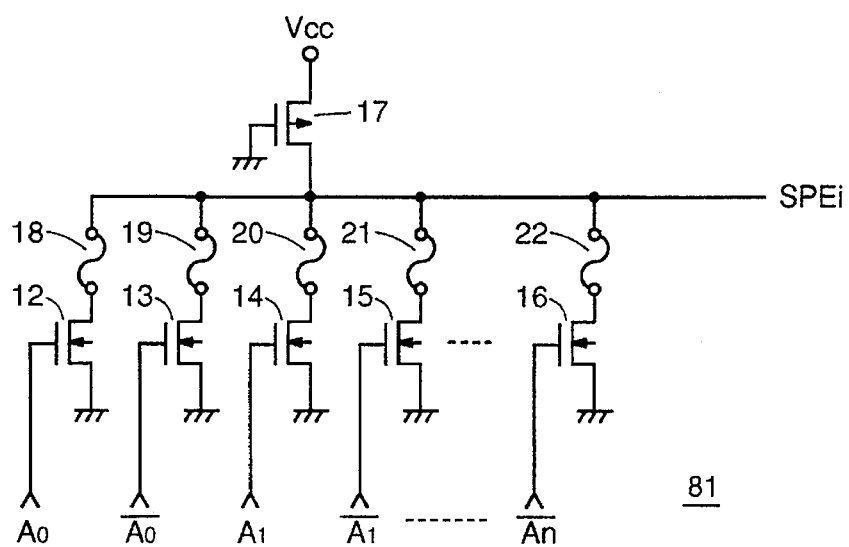
FIG. 34 is a circuit diagram showing an arrangement of one basic circuit in FIG. 31.

FIG. 30 is a circuit diagram showing an arrangement of a redundant column address sensing circuit used instead of the redundant column address sensing circuit shown in FIG. 23. As opposed to the first embodiment of FIG. 23, the redundant column address sensing circuit of the second embodiment includes an external pad 215, inverters 2222 and 2225, a P channel MOS transistor 2223, a resistance 2224, and NAND gates 2226 and 2227. Voltage PC at external pad 215 is applied to one input node of NAND gate 2226 through resistance 2224, and is also applied to one input node of NAND gate 2227 through inverter 2225. P channel MOS transistor 2223 has small size, external power supply voltage EVcc is applied to a source electrode thereof, and ground voltage is applied to a gate electrode thereof. Accordingly, when external pad 215 is in a floating state, the P channel MOS transistor pulls up voltage at node PCC to an H level.

If the semiconductor memory device enters into a redundant column test mode, a redundant column test activation signal $\overline{TEST2}$ falls to an L level, so that both NAND gates 2226 and 2227 are activated. At this time, if external pad 215 is in a floating state or a signal at an H level is applied to external pad 215, an output signal $\overline{TAC}$ of NAND gate 2226 falls to an L level. Therefore, if a column decode activation signal CDE attains an H level, a redundant column activation signal SCEA is activated to an H level. On the other hand, if a signal at an L level is applied to external pad 215, an output signal $\overline{TAC}$ of NAND gate 2226 attains an H level and an output signal $\overline{TBD}$ of NAND gate 2227 falls to an L level. Accordingly, if a column decode activation signal CDE attains an H level, a redundant column activation signal SCEB is activated to an H level. In addition, if a redundant column test activation signal $\overline{TEST2}$ falls to an L level, a redundant column activation signal NCE falls to an L level immediately.

Thus, since 2-system redundant column activation signals SCEA and SCEC and redundant column activation signals SECB and SCED are switched by external pad 215, a functional test of all the redundant column memory cells except a redundant column memory cell located at an intersection of a redundant row, and a redundant column and a normal column can be carried out with external application of an address.

In addition, if the semiconductor memory device enters into a redundant row test mode and a redundant column test mode simultaneously, a functional test of a redundant memory cell located at an intersection of a redundant row and a redundant column can be carried out by changing applied voltages PR an PC of external pads 214 and 215, respectively, and inputting an address and a lower address required for selection of a memory cell array block.

Although a structure in which a redundant row test mode and a redundant column test mode can be switched by external pads 214 and 215 has been described in the second embodiment, all the redundant memory cells can be tested in a manner similar to the manners of the first and the second embodiments by enabling a redundant row test mode to be switched by an external pad and enabling a redundant column test mode to be switched by an externally applied address as in the case of the first embodiment.

In addition, all the redundant memory cells can be tested as in the first and second embodiments by enabling a redundant row test mode to be switched by an externally applied address and enabling a redundant column test mode to be switched by an external pad. According to the semiconductor memory device of the second embodiment, effects similar to those described above in (7.1)–(7.8) of the first embodiment can be obtained, and further, a functional test of redundant memory cells can be performed at the time of a die sort test by applying a probe or the like directly to external pads for switching systems of redundant rows and redundant columns. Therefore, reliable switching of redundant systems can be carried out more easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of normal word lines;

a plurality of normal bit line pairs located across said normal word lines;

a plurality of normal memory cells located respectively corresponding to intersections of said normal word lines and said normal bit line pairs;

normal row selecting means responsive to an externally applied row address signal for selecting one of said normal word lines;

normal column selecting means responsive to an externally applied column address signal for selecting one of said normal bit line pairs;

a plurality of redundant word lines located across said normal bit line pairs;

a redundant bit line pair located across said normal word lines and said redundant word lines;

a plurality of redundant row memory cells located respectively corresponding to intersections of said redundant word lines and said normal bit line pairs;

a plurality of redundant column memory cells located respectively corresponding to intersections of said redundant bit line pair and said normal word lines;

a plurality of redundant row column memory cells located corresponding to an intersection of said redundant word lines and said redundant bit line pair;

a plurality of redundant row decoders responsive to a single redundant row address signal for selecting said redundant word lines;

row substituting means for deactivating said normal row selecting means and activating said single redundant row address signal when a row address signal to be applied to said normal row selecting means indicates a predetermined row substitute address;

row substitution control line means responsive to a predetermined row test signal for forcibly activating said single redundant row address signal and controlling said row substituting means so as to deactivate said normal row selecting means and to activate said plurality of redundant row decoders;

redundant column selecting means for selecting said redundant bit line pair;

column substituting means for deactivating said normal column selecting means and activating said redundant column selecting means when a column address signal to be applied to said normal column selecting means indicates a predetermined column substitute address; and column substitution controlling means responsive to a predetermined column test signal for forcibly controlling said column substituting means so as to deactivate said normal column selecting means and to activate said redundant column selecting means.

2. The semiconductor memory device according to claim 1, further comprising:

test signal generating means responsive to an externally applied control signal for generating said row test signal and/or said column test signal.

3. The semiconductor memory device according to claim 2, further comprising:

parallel reading means responsive to one row address signal and one column address signal for reading in parallel a plurality of data from any of said normal memory cells, said redundant row memory cells, said redundant column memory cells and said redundant row column memory cells; and match/mismatch detecting means responsive to a predetermined multi-bit test signal for detecting whether all the data read by said parallel reading means match each other or not, and generating a match/mismatch detection signal indicating a first value if all of said data match each other and indicating a second value different from said first value if one of said data does not match another data, wherein said test signal generating means further generates said multi-bit test signal in response to an externally applied control signal.

4. A semiconductor memory device comprising:

a plurality of blocks each including (a) a plurality of normal word lines, (b) a plurality of normal row decoders each provided corresponding to a first number of normal word lines out of said plurality of normal word lines, and responsive to a first number of normal word line driving signals applied respectively corresponding to a first number of corresponding normal word lines for selectively driving the first number of corresponding normal word lines, (c) first and second redundant word lines, (d) a redundant row decoder provided corresponding to said first and second redundant word lines, and responsive to a first redundant word line driving signal for driving said first redundant word line and responsive to a second redundant word line driving signal for driving said second redundant word line, (e) a plurality of bit line pairs located across said plurality of normal word lines and said first and second redundant word lines, (f) a plurality of normal memory cells located respectively corresponding to intersections of said normal word lines and said bit line pairs, and (g) a plurality of redundant memory cells located respectively corresponding to intersections of said first and second redundant word lines and said bit line pairs;

normal word line selecting means responsive to an externally applied row address signal for supplying said first number of normal word line driving signals to each of said normal row decoders in said plurality of blocks;

first program means in which a first row substitute address can be programmed;

first sensing means for sensing whether said row address signal matches said first row substitute address programmed in said first program means or not, and generating a first redundant row activation signal if they match each other;

first row substitution controlling means responsive to a predetermined row test signal and said row address signal for forcibly controlling said first sensing means so as to generate said first redundant row activation signal;

second program means in which a second row substitute address can be programmed;

second sensing means for sensing whether said row address signal matches said second row substitute address programmed in said second program means or not, and generating a second redundant row activation signal if they match each other;

second row substitution controlling means responsive to said row test signal and said row address signal for forcibly controlling said second sensing means so as to generate said second redundant row activation signal;

redundant word line selecting means responsive to said first redundant row activation signal applied from said first sensing means for supplying said first redundant word line driving signal to each redundant row decoder in said plurality of blocks, and responsive to said second redundant row activation signal applied from said second sensing means for supplying said second redundant word line driving signal to each redundant row decoder in said plurality of blocks; and deactivating means responsive to one of said first and second redundant row activation signals for deactivating said normal word line selecting means.

5. A semiconductor memory device comprising:

a plurality of blocks each including (a) a plurality of word lines, (b) a plurality of normal bit line pairs located across said word lines, (c) a plurality of normal memory cells located respectively corresponding to said word lines and said normal bit line pairs, (d) a plurality of normal column selection gate pairs provided corresponding to said normal bit line pairs and each being connected to a corresponding normal bit line pair, (e) first and second redundant bit line pairs located across said word lines, (f) a plurality of redundant memory cells located respectively corresponding to intersections of said word lines and said first and second redundant bit line pairs, (g) a first redundant column selection gate pair connected to said first redundant bit line pair, and (h) a second redundant column selection gate pair connected to said second redundant bit line pair;

a plurality of normal column selection lines provided corresponding to said plurality of normal column selection gate pairs, and each being connected to a control electrode of each normal column selection gate pair in a plurality of corresponding blocks;

a first redundant column selection line connected to a control electrode of each of said first redundant column selection gate pairs in said plurality of blocks;

a second redundant column selection line connected to a control electrode of each of said second redundant column selection gate pairs in said plurality of blocks;

normal column selecting means responsive to an externally applied column address signal for selecting one of said normal column selection lines;

first program means in which a first column substitute address can be programmed for generating a first match signal when an externally applied column address signal matches said first column substitute address;

first sensing means responsive to said first match signal applied from said first program means for generating a first redundant column activation signal;

first column substitution controlling means responsive to a predetermined column test signal and said column address signal for forcibly controlling said first sensing means so as to generate said first redundant column activation signal;

second program means in which a second column substitute address can be programmed for generating a second match signal when said column address signal matches said second column substitute address;

second sensing means responsive to said second match signal applied from said second program means for generating a second redundant column activation signal;

second column substitution controlling means responsive to said column test signal and said column address signal for forcibly controlling said second sensing means so as to generate said second redundant column activation signal;

redundant column selecting means responsive to said first redundant column activation signal applied from said first sensing means for selecting said first redundant column selection line, and responsive to said second redundant column activation signal applied from said second sensing means for selecting said second redundant column selection line; and deactivating means responsive to one of said first and second match signals and said column test signal for deactivating said normal column selecting means.

6. A semiconductor memory device comprising:

a plurality of blocks each including (a) a plurality of normal word lines, (b) a plurality of normal row decoders each provided corresponding to a first number of normal word lines out of said plurality of normal word lines, and responsive to a first number of normal word line driving signals applied corresponding to a first number of corresponding normal word lines for selectively driving the first number of corresponding normal word lines, (c) first and second redundant word lines, (d) a redundant row decoder provided corresponding to said first and second redundant word lines, and responsive to a first redundant word line driving signal for driving said first redundant word line and responsive to a second redundant word line driving signal for driving said second redundant word line, (e) a plurality of bit line pairs located across said plurality of normal word lines and said first and second redundant word lines, (f) a plurality of normal memory cells located respectively corresponding to intersections of said normal word lines and said bit line pairs, and (g) a plurality of redundant memory cells located respectively corresponding to intersections of said first and second redundant word lines and said bit line pairs;

normal word line selecting means responsive to an externally applied row address signal for supplying said first number of normal word line driving signals to each of said normal row decoders in said plurality of blocks;

a switching pad;

first program means in which a first row substitute address can be programmed;

first sensing means for sensing whether said row address signal matches said first row substitute address programmed in said first program means or not, and generating a first redundant row activation signal if they match each other;

first row substitution controlling means responsive to a predetermined row test signal and a first potential of said switching pad for forcibly controlling said first sensing means so as to generate said first redundant row activation signal;

second program means in which a second row substitute address can be programmed;

second sensing means for sensing whether said row address signal matches said second row substitute address programmed to said second program means or not, and generating a second redundant row activation signal if they match each other;

second row substitution controlling means responsive to said row test signal and a second potential different from said first potential of said switching pad for forcibly controlling said second sensing means so as to generate said second redundant row activation signal;

redundant word line selecting means responsive to said first redundant row activation signal applied from said first sensing means for supplying said first redundant word line driving signal to each redundant row decoder in said plurality of blocks, and responsive to said second redundant row activation signal applied from said second sensing means for supplying said second redundant word line driving signal to each redundant row decoder in said plurality of blocks; and deactivating means responsive to one of said first and second redundant row activation signals for deactivating said normal word line selecting means.

7. A semiconductor memory device comprising:

a plurality of blocks each including (a) a plurality of word lines, (b) a plurality of normal bit line pairs located across said word lines, (c) a plurality of normal memory cells located respectively corresponding to intersections of said word lines and said normal bit line pairs;

(d) a plurality of normal column selection gate pairs provided corresponding to said normal bit line pairs and each being connected to a corresponding normal bit line pair, (e) first and second redundant bit line pairs located across said word lines, (f) a plurality of redundant memory cells located respectively corresponding to intersections of said word lines and said first and second redundant bit line pairs, (g) a first redundant column selection gate pair connected to said first redundant bit line pair, and (h) a second redundant column selection gate pair connected to said second redundant bit line pair;

a plurality of normal column selection lines provided corresponding to said plurality of normal column selection gate pairs, and each being connected to a control electrode of each of said normal column selection gate pairs in a plurality of corresponding blocks;

a first redundant column selection line connected to a control electrode of each of the first redundant column selection gate pairs in said plurality of blocks;

a second redundant column selection line connected to a control electrode of each of the second redundant column selection gate pairs in said plurality of blocks;

normal column selecting means responsive to an externally applied column address signal for selecting one of said normal column selection lines;

a switching pad;

first program means in which a first column substitute address can be programmed for generating a first match signal when an externally applied column address signal matches said first column substitute address;

first sensing means responsive to said first match signal applied from said first program means for generating a first redundant column activation signal;

first column substitution controlling means responsive to a predetermined column test signal and a first potential of said switching pad for forcibly controlling said first sensing means so as to generate said first redundant column activation signal;

second program means in which a second column substitute address can be programmed for generating a second match signal when said column address signal matches said second column substitute address;

second sensing means responsive to said second match signal applied from said second program means for generating a second redundant column activation signal;

second column substitution controlling means responsive to said column test signal and a second potential different from said first potential of said switching pad for forcibly controlling said second sensing means so as to generate said second redundant column activation signal;

redundant column selecting means responsive to said first redundant column activation signal applied from said first sensing means for selecting said first redundant column selection line, and responsive to said second redundant column activation signal applied from said second sensing means for selecting said second redundant column selection line; and deactivating means responsive to one of said first and second match signals and said column test signal for deactivating said normal column selecting means.

* * * * *